US012740212B2

(12) United States Patent
Jang et al.

(10) Patent No.: US 12,740,212 B2
(45) Date of Patent: Sep. 15, 2026

(54) DISPLAY DEVICE

(71) Applicant: LG Display Co., Ltd., Seoul (KR)

(72) Inventors: Youngin Jang, Seoul (KR); Soyoung Lee, Seoul (KR); Hyungon Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 717 days.

(21) Appl. No.: 18/139,118

(22) Filed: Apr. 25, 2023

(65) Prior Publication Data

US 2024/0178359 A1 May 30, 2024

(30) Foreign Application Priority Data

Nov. 29, 2022 (KR) ........................ 10-2022-0162843

(51) Int. Cl.

| | |
|---|---|
| ***H10H 20/857*** | (2025.01) |
| ***G09F 9/302*** | (2006.01) |
| ***G09F 9/33*** | (2006.01) |
| ***H10D 86/40*** | (2025.01) |
| ***H10D 86/60*** | (2025.01) |
| ***H10H 20/825*** | (2025.01) |
| ***H10H 20/831*** | (2025.01) |
| ***H10W 90/00*** | (2026.01) |

(52) U.S. Cl.

CPC ......... *H10H 20/857* (2025.01); *G09F 9/3026* (2013.01); *G09F 9/33* (2013.01); *H10D 86/441* (2025.01); *H10D 86/60* (2025.01); *H10H 20/825* (2025.01); *H10H 20/8312* (2025.01); *H10W 90/00* (2026.01)

(58) Field of Classification Search

None

See application file for complete search history.

(56) References Cited

U.S. PATENT DOCUMENTS

2020/0403116 A1* 12/2020 Li ......................... H01L 25/167

FOREIGN PATENT DOCUMENTS

KR 10-2015-0061409 A 6/2015

OTHER PUBLICATIONS

A machine-generated English translation of KR 20150061409 (Year: 2015).*

* cited by examiner

*Primary Examiner* — Bo B Jang

(74) *Attorney, Agent, or Firm* — Birch, Stewart, Kolasch & Birch, LLP

(57) ABSTRACT

A display device can includes a substrate in which a plurality of sub pixels are defined; a light emitting diode disposed in a sub pixel among the plurality of sub pixels on the substrate; and a first transistor which is disposed in the sub pixel and configured to supply a driving current to the light emitting diode. Also, the first transistor can be a high electron mobility transistor (HEMT). Accordingly, the first transistor can have a high electron mobility to supply a high current to the light emitting diode and display a high luminous image.

23 Claims, 15 Drawing Sheets

DISPLAY DEVICE

CROSS-REFERENCE TO RELATED APPLICATIONS

This application claims priority to Korean Patent Application No. 10-2022-0162843 filed in the Republic of Korea on Nov. 29, 2022, the entirety of which is incorporated by reference into the present application.

BACKGROUND

Field

The present disclosure relates to a display device, and more particularly, to a display device using a light emitting diode (LED) and a high electron mobility transistor.

Description of the Related Art

There are different types of display devices that can be used for a monitor of a computer, a television, or a cellular phone, such as an organic light emitting display (OLED) device which is a self-emitting device and a liquid crystal display (LCD) device which requires a separate light source (e.g., a backlight unit).

There is a wide range for applications for which a display device can be utilized, such as personal digital assistants as well as monitors of computers and televisions, and a display device with a large display area and a reduced volume and weight is being studied.

Further, in recent years, a display device including an LED (light emitting diode) is attracting attention as a next generation display device. Since the LED is formed of an inorganic material, rather than an organic material, reliability is excellent and the lifespan is longer than that of the liquid crystal display device or the organic light emitting display device. Further, the LED has a fast lighting speed, excellent luminous efficiency, and a strong impact resistance so that stability is excellent, and an image having a high luminance can be displayed. However, when sub pixels are made smaller in order to increase resolution, the luminance may decrease. To combat this, increasing the luminance often involves using a larger driving transistor to provide more current, which can take up a lot of space and impair the resolution. Also, having to transfer and align a large number of small LEDs, e.g., one LED per sub-pixel and also form corresponding driving transistors for each of the sub pixels can cause problems, such as low yields and increased manufacturing time and costs.

SUMMARY OF THE DISCLOSURE

An object to be achieved by the present disclosure is to provide a display device which is capable of supplying a high current to a light emitting diode.

Another object to be achieved by the present disclosure is to provide a display device which supplies a high driving current to a light emitting diode to display an image with a high luminance.

Still another object to be achieved by the present disclosure is to provide a display device which supplies a high driving current to the light emitting diode without increasing a channel width of a driving transistor which supplies a driving current.

Still another object to be achieved by the present disclosure is to provide a display device in which a design area of a driving transistor is minimized.

Still another object to be achieved by the present disclosure is to provide a display device in which a process of precisely aligning a transistor and a light emitting diode, during the transferring by transferring the transistor and the light emitting diode by a self-assembling method, is simplified and more reliable.

Still another object to be achieved by the present disclosure is to provide a display device in which the light emitting diode and the driving transistor are integrated to combine self-assembling and transferring processes of the light emitting diode and the driving transistor.

Objects of the present disclosure are not limited to the above-mentioned objects, and other objects, which are not mentioned above, can be clearly understood by those skilled in the art from the following descriptions.

According to an aspect of the present disclosure, a display device includes a substrate in which a plurality of sub pixels are defined; a light emitting diode disposed in each of the plurality of sub pixels on the substrate; and a first transistor which is disposed in each of the plurality of sub pixels on the substrate to supply a driving current to the light emitting diode, and the first transistor is a high electron mobility transistor (HEMT). Accordingly, the first transistor is formed as a high electron mobility transistor having a high electron mobility to supply a high current to the light emitting diode and display a high luminous image.

Other detailed matters of the example embodiments are included in the detailed description and the drawings.

According to the present disclosure, a high current is supplied to the light emitting diode to display an image with a high luminance.

According to the present disclosure, a driving transistor is configured by a high electron mobility transistor to supply a high current to the light emitting diode while minimizing a design area of the driving transistor.

According to the present disclosure, the driving transistor and the light emitting diode are configured by the same series of materials to form the light emitting diode and the driving transistor as an integrated structure.

According to the present disclosure, the driving transistor and the light emitting diode are transferred onto the display device by a self-assembling method to simplify and improve reliability of a process of precisely aligning the driving transistor and the light emitting diode.

According to the present disclosure, the driving transistor is configured by a high electron mobility transistor which is capable of supplying a high current to implement a highly efficient display device with low power.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
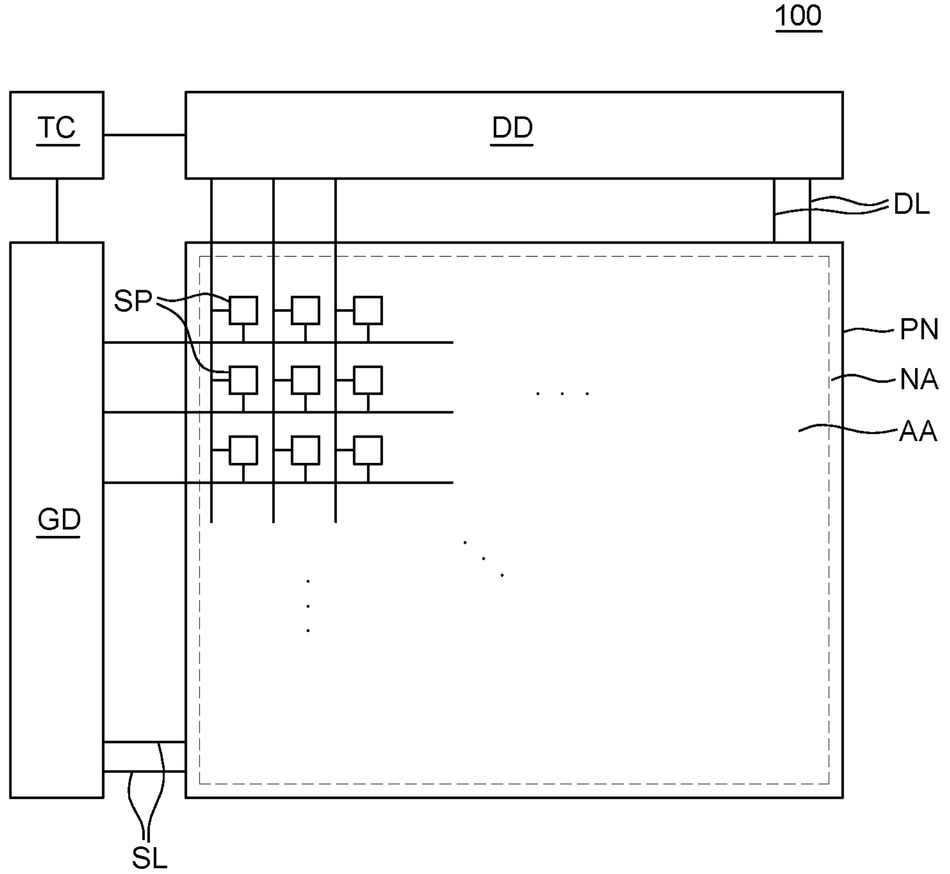
FIG. 1 is a schematic diagram of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as “including,” “having,” and “comprising” used herein are generally intended to allow other components to be added unless the terms are used with the term “only.” Any references to singular can include plural unless expressly stated otherwise.

Components are interpreted to include an ordinary error range even if not expressly stated.

When the position relation between two parts is described using the terms such as “on,” “above,” “below,” and “next,” one or more parts can be positioned between the two parts unless the terms are used with the term “immediately” or “directly.”

When an element or layer is disposed “on” another element or layer, it can be directly disposed on the another element or layer, or another layer or another element can be interposed therebetween.

Although the terms “first,” “second,” and the like are used for describing various components, these components are not confined by these terms. These terms are merely used for distinguishing one component from the other components. Therefore, a first component to be mentioned below can be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

FIG. 1 is a schematic diagram of a display device according to an example embodiment of the present disclosure. In FIG. 1, for the convenience of description, among various components of the display device 100, only a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC in accordance with a plurality of data control signals supplied from the timing controller TC into a data voltage using a reference gamma voltage. The data driver DD can supply the converted data voltage to the plurality of data lines DL.

The timing controller TC aligns image data input from the outside to supply the image data to the data driver DD. The timing controller TC can generate a gate control signal and a data control signal using synchronization signals input from the outside, such as a dot clock signal, a data enable signal, and horizontal/vertical synchronization signals. The timing controller TC supplies the generated gate control signal and data control signal to the gate driver GD and the data driver DD, respectively, to control the gate driver GD and the data driver DD.

The display panel PN is a configuration which displays images to the user, and includes the plurality of sub pixels SP. In the display panel PN, the plurality of scan lines SL and the plurality of data lines DL intersect each other, and the plurality of sub pixels SP is connected to the scan line SL and the data line DL, respectively. Also, each of the plurality of sub pixels SP can be connected to a high potential power line VDD, a low potential power line VSS, and a reference line RL.

In the display panel PN, a display area AA and a non-display area NA enclosing the display area AA can be defined.

The display area AA is an area in which images are displayed in the display device 100. In the display area AA, a plurality of sub pixels SP which configures a plurality of pixels PX (see FIG. 2B) and a circuit for driving the plurality of sub pixels SP can be disposed. The plurality of sub pixels SP is a minimum unit which configures the display area AA, and n sub pixels SP can form one pixel PX. In each of the plurality of sub pixels SP, a light emitting diode and a thin film transistor for driving the light emitting diode can be disposed. The plurality of light emitting diodes can be defined in different manners depending on the type of the display panel PN. For example, when the display panel PN is an inorganic light emitting display panel PN, the light emitting diode can be a light emitting diode (LED) or a micro light emitting diode (LED).

In the display area AA, a plurality of signal lines which transmit various signals to the plurality of sub pixels SP are disposed. For example, the plurality of signal lines can include a plurality of data lines DL which supply data voltages to the plurality of sub pixels SP and a plurality of scan lines SL which supply a gate voltage to the plurality of sub pixels SP. The plurality of scan lines SL extend from the display area AA in one direction to be connected to the plurality of sub pixels SP, and the plurality of data lines DL extend from the display area AA in a direction different from the one direction to be connected to the plurality of sub pixels SP. In addition, in the display area AA, a low potential power line and a high potential power line can be further disposed, but it is not limited thereto.

The non-display area NA is an area where images are not displayed so that the non-display area NA can be defined as an area extending from the display area AA. In the non-display area NA, a link line which transmits a signal to the sub pixel SP of the display area AA, a pad electrode, or a driving IC, such as a gate driver IC or a data driver IC, can be disposed.

Also, the non-display area NA can be located on a rear surface of the display panel PN, that is, a surface on which the sub pixels SP are not disposed or can be omitted, and is not limited as illustrated in the drawing.

In addition, a driver such as a gate driver GD, a data driver DD, and a timing controller TC can be connected to the display panel PN in various ways. For example, the gate driver GD can be mounted in the non-display area NA in a gate in panel (GIP) manner or mounted between the plurality of sub pixels SP in the display area AA in a gate in display area (GIA) manner. For example, the data driver DD and the timing controller TC are formed in separate flexible film and printed circuit board, and the display panel PN is electrically connected to the data driver DD and the timing controller TC by bonding the flexible film and the printed circuit board to the pad electrode formed in the non-display area NA of the display panel PN. If the gate driver GD is mounted in the GIP manner, and the data driver DD and the timing controller TC transmit a signal to the display panel PN through a pad electrode of the non-display area NA, an area of the non-display area NA to dispose the gate driver GD and the pad electrode needs to be ensured. By doing this, a bezel can be increased.

In contrast, when the gate driver GD is mounted in the display area AA in the GIA manner, and a side line SRL (see FIG. 2A) which connects the signal line on the front surface of the display panel PN to the pad electrode on a rear surface of the display panel PN is formed to bond the flexible film and the printed circuit board onto a rear surface of the display panel PN, the non-display area NA can be minimized on the front surface of the display panel PN. That is, when the gate driver GD, the data driver DD, and the timing controller TC are connected to the display panel PN as described above, a zero bezel in which there is no bezel can be substantially implemented, which will be described in more detail with reference to FIGS. 2A and 2B.

Figure 2A:
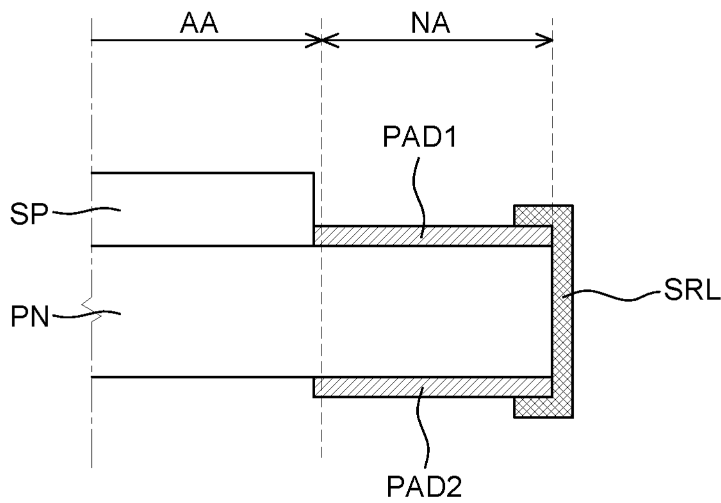
FIG. 2A is a partial cross-sectional view of a display device according to an embodiment of the present disclosure.
Figure 2B:
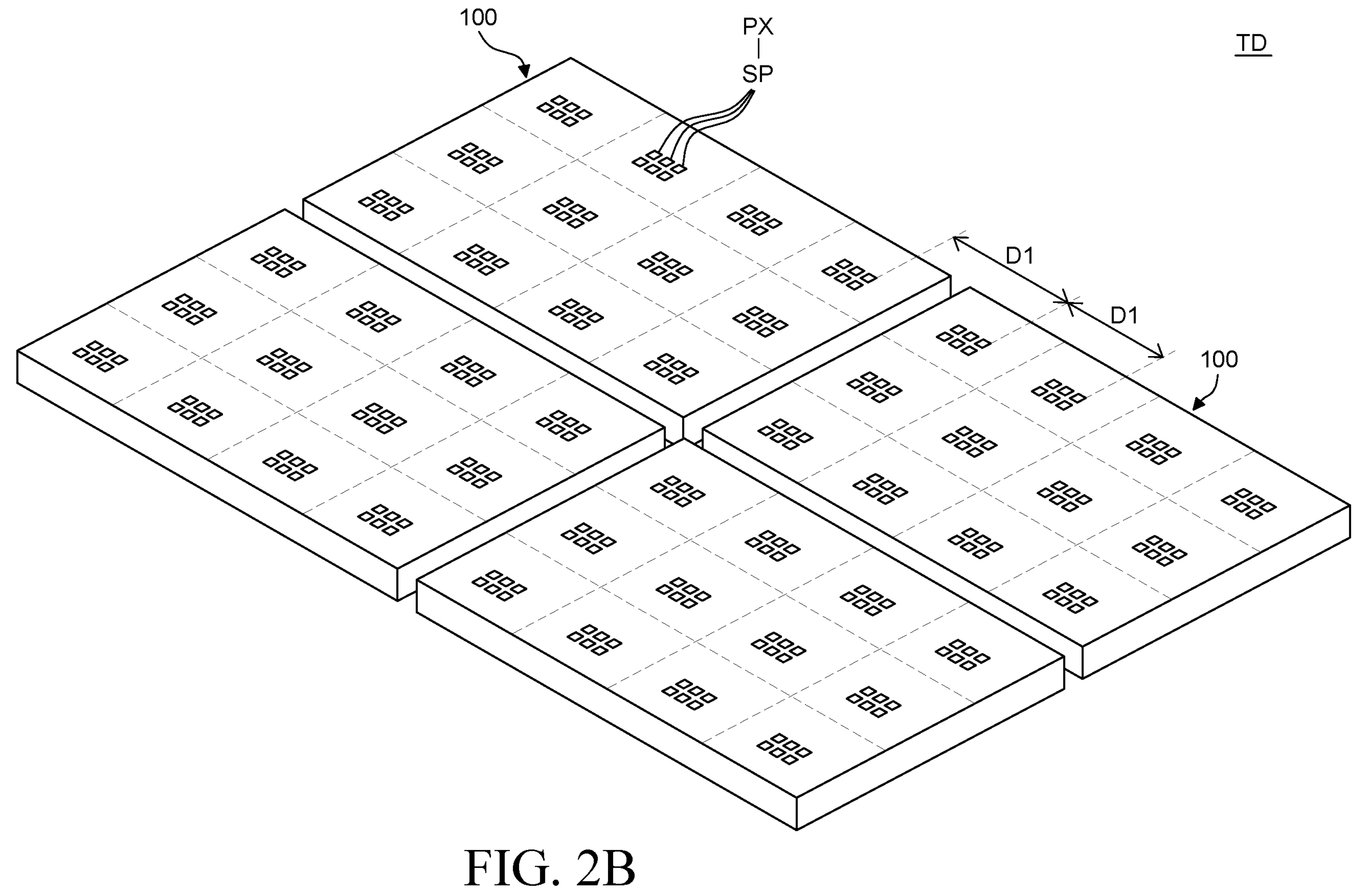
FIG. 2B is a perspective view of a tiling display device according to an embodiment of the present disclosure.

FIG. 2A is a partial cross-sectional view of a display device according to an example embodiment of the present disclosure. FIG. 2B is a perspective view of a tiling display device according to an example embodiment of the present disclosure.

In the non-display area NA of the display panel PN, a plurality of pad electrodes for transmitting various signals to the plurality of sub pixels SP are disposed. For example, in the non-display area NA of the front surface of the display panel PN, a first pad electrode PAD1 which transmits a signal to the plurality of sub pixels SP is disposed. In the non-display area NA of the rear surface of the display panel PN, a second pad electrode PAD2 which is electrically connected to a driving component, such as a flexible film and the printed circuit board, is disposed.

In this situation, various signal lines connected to the plurality of sub pixels SP, for example, a scan line SL or a data line DL, extend from the display area AA to the non-display area NA to be electrically connected to the first pad electrode PAD1.

The side line SRL is disposed along a side surface of the display panel PN. The side line SRL can electrically connect a first pad electrode PAD1 on the front surface of the display panel PN and a second pad electrode PAD2 on the rear surface of the display panel PN. Therefore, a signal from a driving component on the rear surface of the display panel PN can be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-display area NA on the front surface of the display panel PN.

Referring to FIG. 2B, a tiling display device TD having a large screen size can be implemented by connecting a plurality of display devices 100. At this time, when the tiling display device TD is implemented using a display device 100 with a minimized bezel as illustrated in FIG. 2A, a seam area, in which an image between the display devices 100 is not displayed, is minimized so that a display quality can be improved.

For example, the plurality of sub pixels SP can form one pixel PX, and a distance D1 between an outermost pixel PX of one display device 100 and an outermost pixel PX of another display device 100 adjacent to the one display device can be implemented to be equal to a distance D1 between pixels PX in one display device 100. Accordingly, a constant distance between pixels PX between the display devices 100 is configured to minimize the seam area.

However, FIGS. 2A and 2B are illustrative so that the display device 100 according to the example embodiment of the present disclosure can also be a general display device 100 with a bezel, but is not limited thereto.

Hereinafter, the sub pixel SP of the display device 100 according to the example embodiment of the present disclosure will be described in more detail with reference to FIGS. 3 to 5.

Figure 3:
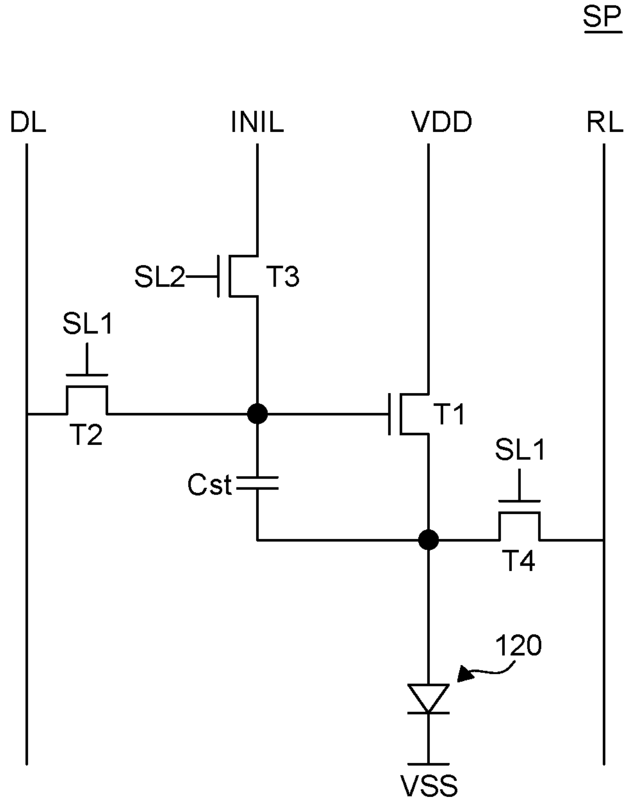
FIG. 3 is a circuit diagram of a sub pixel of a display device according to an embodiment of the present disclosure.

FIG. 3 is a circuit diagram of a sub pixel of a display device according to an example embodiment of the present disclosure.

Referring to FIG. 3, each of the plurality of sub pixels SP includes a first transistor T1, a second transistor T2, a third transistor T3, a fourth transistor T4, a storage capacitor Cst, and a light emitting diode 120. Each of the plurality of sub pixels SP is connected to the plurality of scan lines SL, data lines DL, initialization lines INIL, reference lines RL, high potential power lines VDD, and low potential power lines VSS to be driven.

First, the first transistor T1, the second transistor T2, the third transistor T3, and the fourth transistor T4 of each of the plurality of sub pixels SP include gate electrodes, source electrodes, and drain electrodes. The first transistor T1, the second transistor T2, the third transistor T3, and the fourth transistor T4 can be P-type transistors or N-type transistors. For example, since in the P-type transistor, holes move from the source electrode to the drain electrode, the current can flow from the source electrode to the drain electrode. Since in the N-type transistor, electrons move from the source electrode to the drain electrode, the current can flow from the drain electrode to the source electrode. Hereinafter, the description will be made under the assumption that the first transistor T1, the second transistor T2, the third transistor T3, and the fourth transistor T4 are N-type transistors in which the current flows from the drain electrode to the source electrode, but the present disclosure is not limited thereto.

The first transistor T1 is a transistor which supplies a driving current to the light emitting diode 120. The first transistor T1 includes a gate electrode connected to the second transistor T2, a drain electrode connected to the high potential power line VDD, and a source electrode connected to the light emitting diode 120. The first transistor T1 is turned on to control the current flowing to the light emitting diode 120. Accordingly, the first transistor T1 which controls the driving current can be referred to as a driving transistor.

The second transistor T2 is a transistor which transmits a data voltage to the gate electrode of the first transistor T1. The second transistor T2 includes a gate electrode connected to the first scan line SL1, a drain electrode connected to the data line DL, and a source electrode connected to the gate electrode of the first transistor T1. The second transistor T2 can be turned on by a signal from the first scan line SL1, and a data voltage from the data line DL can be transmitted to the gate electrode of the first transistor T1 through the turned-on second transistor T2. Accordingly, the second transistor T2 can be referred to as a switching transistor.

The third transistor T3 is a transistor for initializing a voltage of the gate electrode of the first transistor T1 to an initialization voltage. The third transistor T3 includes a gate electrode connected to the second scan line SL2, a drain electrode connected to the initialization line INIL, and a source electrode connected to the gate electrode of the first transistor T1. The third transistor T3 can be turned on by a signal from the second scan line SL2, and an initialization voltage from the initialization line INIL can be transmitted to the gate electrode of the first transistor T1 through the turned-on third transistor T3.

The fourth transistor T4 is a transistor for compensating for a threshold voltage of the first transistor T1. The fourth transistor T4 is connected between the source electrode of the first transistor T1 and the reference line RL. The fourth transistor T4 includes a gate electrode connected to the first scan line SL1, a source electrode and a drain electrode which are connected to the source electrode of the first transistor T1 and the reference line RL, respectively. The fourth transistor T4 is turned on to transmit the reference voltage to the source electrode of the first transistor T1 to sense a threshold voltage of the first transistor T1. Accordingly, the fourth transistor T4 which senses a characteristic of the first transistor T1 can be referred to as a sensing transistor.

The storage capacitor Cst stores a potential difference between the gate electrode and the source electrode of the first transistor T1 while the light emitting diode 120 emits light, so that a constant current can be supplied to the light emitting diode 120. The storage capacitor Cst includes a plurality of capacitor electrodes. Some electrode of the storage capacitor Cst is connected to the gate electrode of the first transistor T1 and the other electrode can be connected to the source electrode of the first transistor T1.

A plurality of light emitting diodes 120 are disposed in the plurality of sub pixels SP. The plurality of light emitting diodes 120 are elements which emit light by the current. The light emitting diode 120 can include a light emitting diode 120 which emits red light, green light, and blue light, and implements various colors of light including white by a combination thereof. Further, various colors of light can be implemented using the light emitting diode 120 which emits a specific color light and a light conversion member which converts light from the light emitting diode 120 into another color of light. The light emitting diode 120 is connected between the first transistor T1 and the low potential power line VSS to be supplied with a driving current from the first transistor T1 to emit light.

Hereinafter, a structure of the sub pixel SP of the display device 100 according to the example embodiment of the present disclosure will be described in more detail with reference to FIGS. 4 to 5B.

Figure 4:
FIG. 4 is an enlarged plan view of a display panel of a display device according to an embodiment of the present disclosure.
Figure 4:
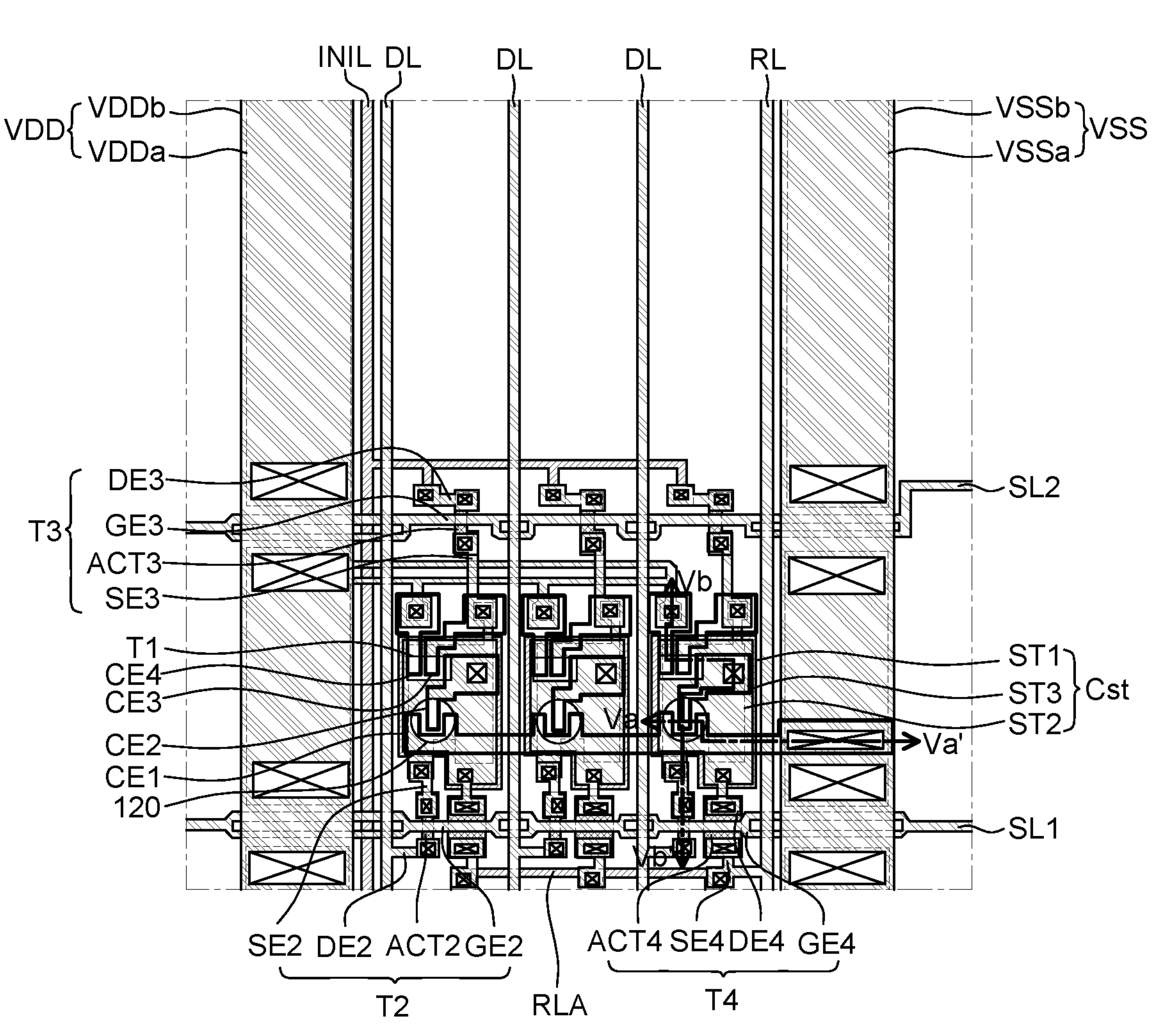
Figure 5A:
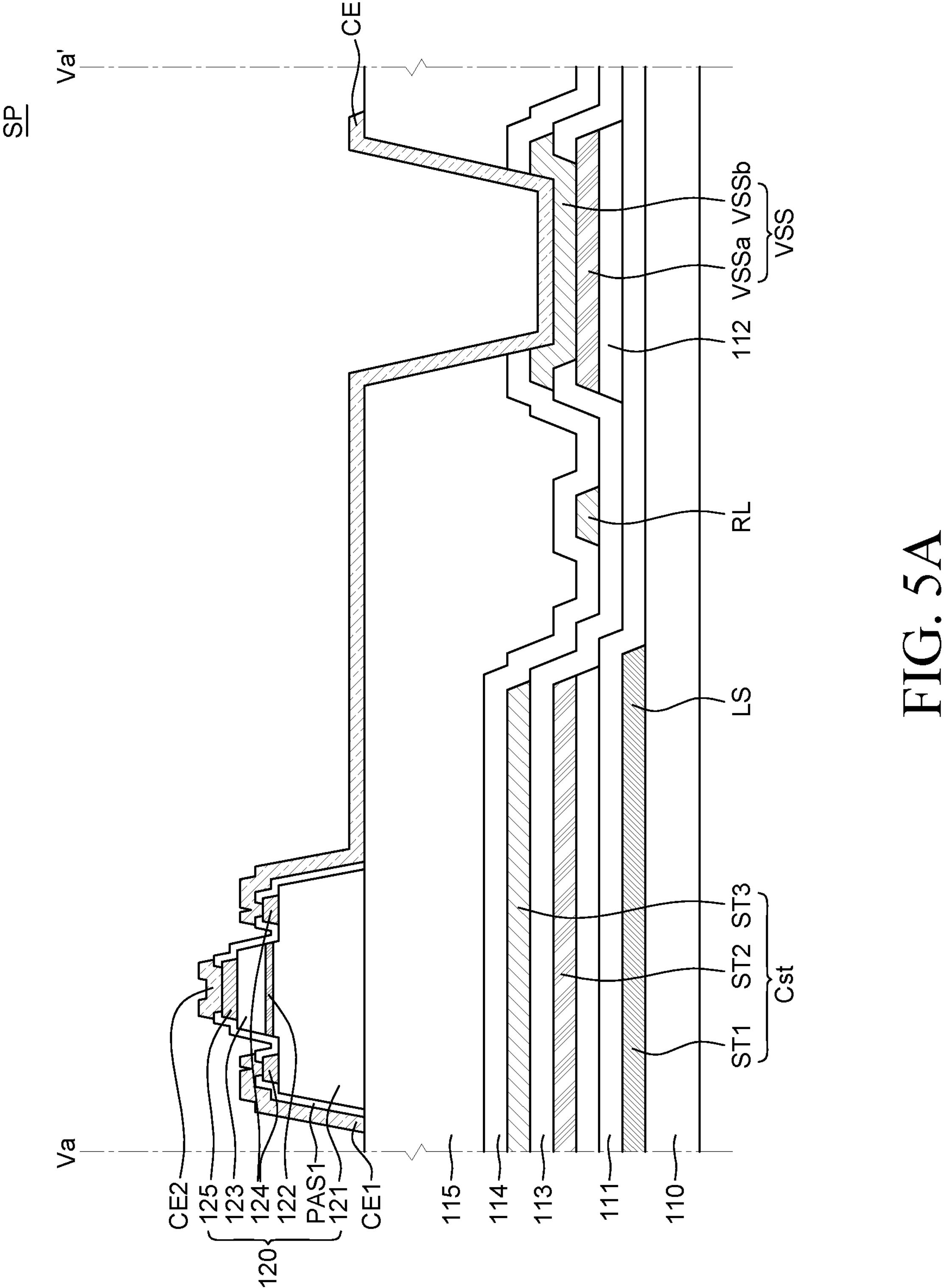
FIG. 5A is a cross-sectional view taken along the line Va-Va' of FIG. 4 according to an embodiment of the present disclosure.

FIG. 4 is an enlarged plan view of a display panel of a display device according to an example embodiment of the present disclosure. FIG. 5A is a cross-sectional view taken along the line Va-Va' of FIG. 4. FIG. 5B is a cross-sectional view taken along the line Vb-Vb' of FIG. 4. FIG. 4 is an enlarged plan view illustrating three sub pixels SP. Even though in FIG. 4, for the convenience of description, a light emitting diode 120 having a circular shape in the plan view is illustrated, a light emitting diode 120 having an oval shape, a rectangular shape, or a triangular shape in the plan view can also be used, but is not limited thereto.

Figure 5B:
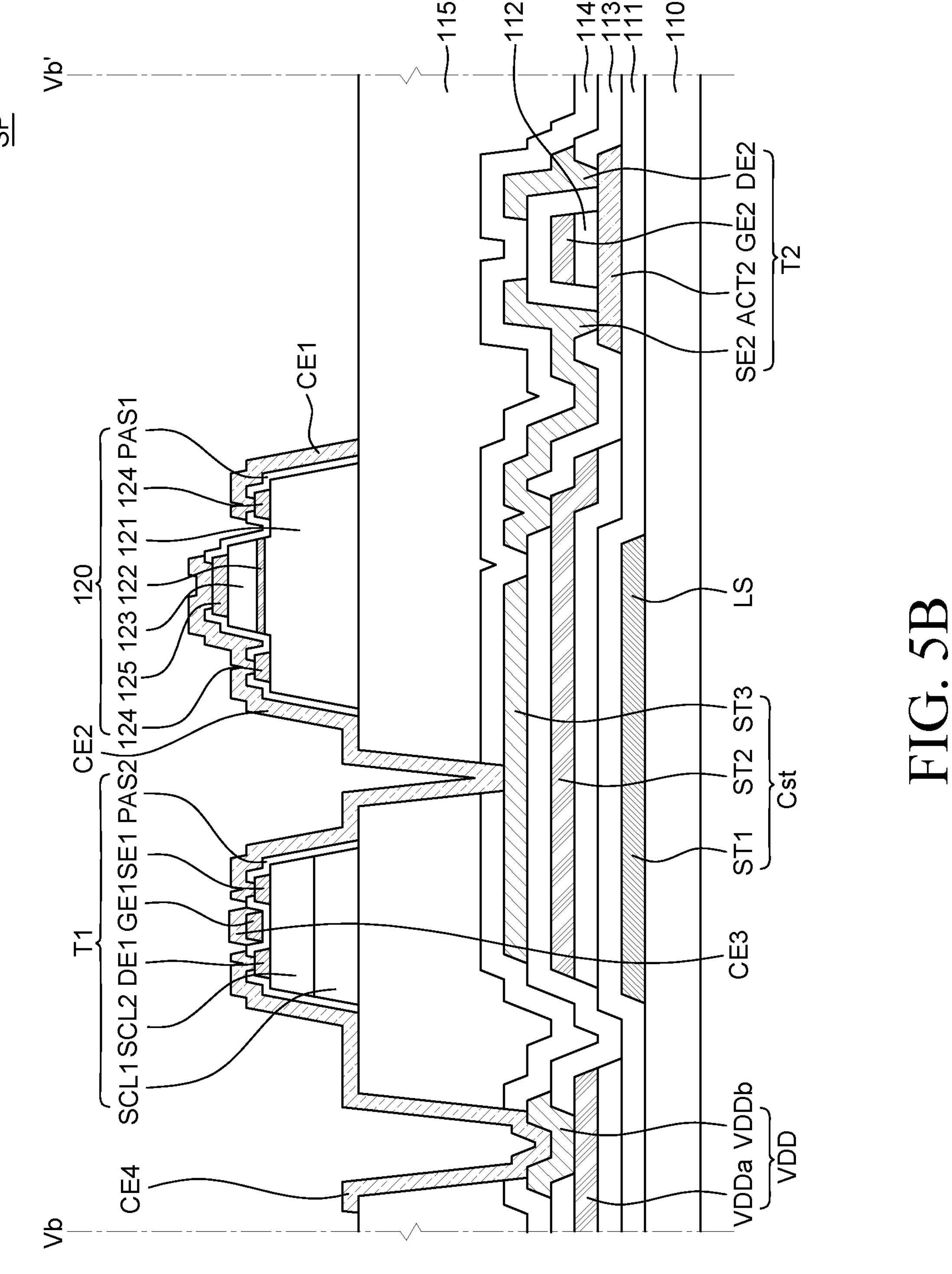
FIG. 5B is a cross-sectional view taken along the line Vb-Vb' of FIG. 4 according to an embodiment of the present disclosure.

Referring to FIGS. 4 to 5B, the display panel PN of the display device 100 according to the example embodiment of the present disclosure includes a substrate 110, a buffer layer 111, a gate insulating layer 112, a first interlayer insulating layer 113, a second interlayer insulating layer 114, an adhesive layer 115, a light shielding layer LS, a first transistor T1, a second transistor T2, a third transistor T3, a fourth transistor T4, a storage capacitor Cst, a first scan line SL1, a second scan line SL2, a data line DL, a reference line RL, an initialization line INIL, a high potential power line VDD, a low potential power line VSS, a first connection electrode CE1, a second connection electrode CE2, a third connection electrode CE3, and a fourth connection electrode CE4.

First, the substrate 110 is a component for supporting various components included in the display device 100 and can be formed of an insulating material. For example, the substrate 110 can be formed of glass or resin. Further, the substrate 110 can be configured to include polymer or plastics, or can be formed of a material having flexibility.

The light shielding layer LS, the initialization line INIL, and an auxiliary reference line RLA are disposed on the substrate 110.

The light shielding layer LS can block light which is incident onto the plurality of transistors from the lower portion of the substrate 110. The light which is incident onto the plurality of transistors is blocked by the light shielding layer LS to reduce a leakage current.

The light shielding layer LS is integrally formed with a first capacitor electrode ST1 of the storage capacitor Cst to be described below. The first capacitor electrode ST1 which is the light shielding layer LS can be electrically connected to a third capacitor electrode ST3 through a contact hole formed in the buffer layer 111 and the first interlayer insulating layer 113.

The initialization line INIL is disposed between the plurality of sub pixels SP on the substrate 110. The initialization line INIL can extend along a column direction between the plurality of sub pixels SP. At this time, a part of the initialization line INIL extends in a row direction and can be electrically connected to a third transistor T3 of each of the plurality of sub pixels SP.

The auxiliary reference line RLA is a wiring line which electrically connects the reference line RL and the fourth transistor T4 of the plurality of sub pixels SP. The auxiliary reference line RLA extends in a row direction, and can electrically connect the fourth source electrode SE4 of the fourth transistor T4 of each of the plurality of sub pixels SP to the reference line RL extending in the column direction.

The buffer layer 111 is disposed on the substrate 110, the light shielding layer LS, the initialization line INIL, and the auxiliary reference line RLA. The buffer layer 111 can reduce permeation of moisture or impurities through the substrate 110. The buffer layer 111 can be configured by a single layer or a double layer of silicon oxide (SiOx) or silicon nitride (SiNx), but is not limited thereto. However, the buffer layer 111 can be omitted depending on a type of substrate 110 or a type of transistor, but is not limited thereto.

A second transistor T2, a third transistor T3, and a fourth transistor T4 are disposed on the buffer layer 111.

The second transistor T2 includes a second active layer ACT2, a second gate electrode GE2, a second source electrode SE2, and a second drain electrode DE2.

The second active layer ACT2 is disposed on the buffer layer 111. The second active layer ACT2 can be formed of a semiconductor material, such as an oxide semiconductor, amorphous silicon, or polysilicon, but is not limited thereto.

The gate insulating layer 112 is disposed on the second active layer ACT2. The gate insulating layer 112 is an insulating layer which insulates the second active layer ACT2 from the second gate electrode GE2, and can be configured by a single layer or a double layer of silicon oxide (SiOx) or silicon nitride (SiNx), but is not limited thereto.

The second gate electrode GE2 is disposed on the gate insulating layer 112. The second gate electrode GE2 can be electrically connected to the first scan line SL1. The second gate electrode GE2 can be configured by a conductive material, such as copper (Cu), aluminum (Al), molybdenum (Mo), nickel (Ni), titanium (Ti), and chrome (Cr), or an alloy thereof, but is not limited thereto.

The first interlayer insulating layer 113 is disposed on the second gate electrode GE2. The first interlayer insulating layer 113 is an insulating layer which protects components below the first interlayer insulating layer 113 and can be configured by a single layer or a double layer of silicon oxide (SiOx) or silicon nitride (SiNx), but is not limited thereto.

A second source electrode SE2 and a second drain electrode DE2 which are electrically connected to the second active layer ACT2 are disposed on the first interlayer insulating layer 113. The second drain electrode DE2 can be electrically connected to the data line DL and the second active layer ACT2. The second source electrode SE2 can be electrically connected to the second active layer ACT2 and the first gate electrode GE1 of the first transistor T1. The second source electrode SE2 and the second drain electrode DE2 can be configured by a conductive material, such as copper (Cu), aluminum (Al), molybdenum (Mo), nickel (Ni), titanium (Ti), and chrome (Cr), or an alloy thereof, but are not limited thereto.

The third transistor T3 is disposed on the buffer layer 111. The third transistor T3 includes a third active layer ACT3, a third gate electrode GE3, a third source electrode SE3, and a third drain electrode DE3.

The third active layer ACT3 is disposed on the buffer layer 111. The third active layer ACT3 can be formed of a semiconductor material such as an oxide semiconductor, amorphous silicon, or polysilicon, but is not limited thereto.

The gate insulating layer 112 is disposed on the third active layer ACT3 and the third gate electrode GE3 is disposed on the gate insulating layer 112. The third gate electrode GE3 can be electrically connected to the second scan line SL2. The third gate electrode GE3 can be configured by a conductive material, such as copper (Cu), aluminum (Al), molybdenum (Mo), nickel (Ni), titanium (Ti), and chrome (Cr), or an alloy thereof, but is not limited thereto.

The first interlayer insulating layer 113 is disposed on the third gate electrode GE3, and the third source electrode SE3 and the third drain electrode DE3 which are electrically connected to the third active layer ACT3 are disposed on the first interlayer insulating layer 113. The third drain electrode DE3 can be electrically connected to the third active layer ACT3 and the initialization line INIL, and the third source electrode SE3 can be electrically connected to the third active layer ACT3 and the first gate electrode GE1 of the first transistor T1. The third source electrode SE3 and the third drain electrode DE3 can be configured by a conductive material, such as copper (Cu), aluminum (Al), molybdenum (Mo), nickel (Ni), titanium (Ti), and chrome (Cr), or an alloy thereof, but are not limited thereto.

The fourth transistor T4 is disposed on the buffer layer 111. The fourth transistor T4 includes a fourth active layer ACT4, a fourth gate electrode GE4, a fourth source electrode SE4, and a fourth drain electrode DE4.

The fourth active layer ACT4 is disposed on the buffer layer 111. The fourth active layer ACT4 can be formed of a semiconductor material such as an oxide semiconductor, amorphous silicon, or polysilicon, but is not limited thereto.

The gate insulating layer 112 is disposed on the fourth active layer ACT4 and the fourth gate electrode GE4 is disposed on the gate insulating layer 112. The fourth gate electrode GE4 can be electrically connected to the first scan line SL1. The fourth gate electrode GE4 can be configured by a conductive material, such as copper (Cu), aluminum (Al), molybdenum (Mo), nickel (Ni), titanium (Ti), and chrome (Cr), or an alloy thereof, but is not limited thereto.

The first interlayer insulating layer 113 is disposed on the fourth gate electrode GE4, and the fourth source electrode SE4 and the fourth drain electrode DE4 which are electrically connected to the fourth active layer ACT4 are disposed on the first interlayer insulating layer 113. The fourth source electrode SE4 can be electrically connected to the fourth active layer ACT4, the auxiliary reference line RLA, and the reference line RL, and the fourth drain electrode DE4 can be electrically connected to the fourth active layer ACT4 and the first source electrode SE1 of the first transistor T1. The fourth source electrode SE4 and the fourth drain electrode DE4 can be configured by a conductive material, such as copper (Cu), aluminum (Al), molybdenum (Mo), nickel (Ni), titanium (Ti), and chrome (Cr), or an alloy thereof, but are not limited thereto.

The second capacitor electrode ST2 is disposed on the buffer layer 111 and the gate insulating layer 112. The second capacitor electrode ST2 can be electrically connected to the first gate electrode GE1 of the first transistor T1 which is a driving transistor, a second source electrode SE2 of the second transistor T2, and a third source electrode SE3 of the third transistor T3. Specifically, the second capacitor electrode ST2 can be electrically connected to the second source electrode SE2 and the third source electrode SE3 through a contact hole of the first interlayer insulating layer 113. The second capacitor electrode ST2 and the third source electrode SE3 can be electrically connected to the third connection electrode CE3 and the first gate electrode GE1 through a contact hole formed in the second interlayer insulating layer 114 and the adhesive layer 115.

A plurality of first low potential power lines VSSa and a plurality of first high potential power lines VDDa are disposed on the buffer layer 111 and the gate insulating layer 112.

The plurality of first low potential power lines VSSa can be disposed along a column direction. The plurality of first low potential power lines VSSa disposed in the same column is disposed to be separate from each other, and then can be electrically connected by the second low potential power line VSSb. That is, the low potential power line VSS can have a double line structure of the first low potential power line VSSa and the second low potential power line VSSb.

The plurality of first high potential power lines VDDa can be disposed along a column direction. Some of the plurality of first high potential power lines VDDa extend in the row direction toward the adjacent sub pixel SP, and can transmit a high potential power voltage to the first transistor T1 of each of the plurality of sub pixels SP. The plurality of first high potential power lines VDDa disposed in the same column are disposed to be separated from each other, and then can be electrically connected to each other by the second high potential power line VDDb. The high potential power line VDD can have a double line structure of the first high potential power line VDDa and the second high potential power line VDDb.

The first scan line SL1 and the second scan line SL2 are disposed on the buffer layer 111 and the gate insulating layer 112. The first scan line SL1 and the second scan line SL2 are wiring lines which transmit a scan signal to each of the plurality of sub pixels SP. The first scan line SL1 and the second scan line SL2 extend in the row direction, and can be disposed to traverse the plurality of sub pixels SP. The first scan line SL1 can be electrically connected to the second gate electrode GE2 of the second transistor T2 and the fourth gate electrode GE4 of the fourth transistor T4 of each of the plurality of sub pixels SP. The second scan line SL2 can be electrically connected to the third gate electrode GE3 of the third transistor T3 of each of the plurality of sub pixels SP.

Next, the second high potential power line VDDb, the second low potential power line VSSb, the plurality of data lines DL, the reference line RL, and the third capacitor electrode ST3 are disposed on the first interlayer insulating layer 113.

The second high potential power line VDDb extends in the column direction between the plurality of sub pixels SP, and can overlap the plurality of first high potential power lines VDDa. The second high potential power line VDDb can be electrically connected to a plurality of first high potential power line VDDa through a contact hole formed in the first interlayer insulating layer 113. Accordingly, the plurality of first high potential power lines VDDa, which are disposed in the same column and spaced apart from each other, can be electrically connected to each other by the second high potential power line VDDb.

The second low potential power line VSSb extends in the column direction between the plurality of sub pixels SP, and can overlap the plurality of first low potential power lines VSSa. The second low potential power line VSSb can be electrically connected to the plurality of first low potential power lines VSSa through a contact hole formed in the first interlayer insulating layer 113. Accordingly, the plurality of first low potential power lines VSSa, which are disposed in the same column and spaced apart from each other, can be electrically connected to each other by the second low potential power line VSSb.

The plurality of data lines DL are wiring lines which transmit the data voltage to each of the plurality of sub pixels SP. Each of the plurality of data lines DL can be connected to the second transistor T2 of one of the plurality of sub pixels SP. The plurality of data lines DL can extend along a column direction between the plurality of sub pixels SP. For example, each of the plurality of data lines DL can transmit a data voltage to a sub pixel SP disposed at a right side of a corresponding one of the plurality of data lines DL.

The reference line RL is a wiring line which transmits a reference voltage to the plurality of sub pixels SP. The reference line RL can be connected to the fourth transistor T4 of each of the plurality of sub pixels SP. The reference line RL can extend along a column direction between the plurality of sub pixels SP. For example, the reference line RL can extend along a column direction between the low potential power line VSS and the sub pixel SP. The reference line RL is electrically connected to the auxiliary reference line RLA extending in the row direction to transmit a reference voltage to the plurality of adjacent sub pixels SP.

The third capacitor electrode ST3 is disposed on the first interlayer insulating layer 113 to overlap the second capacitor electrode ST2. The third capacitor electrode ST3 can be integrally formed with the fourth drain electrode DE4 of the fourth transistor T4. The third capacitor electrode ST3 can be electrically connected to the first capacitor electrode ST1 through a contact hole formed in the first interlayer insulating layer 113 and the buffer layer 111. The third capacitor electrode ST3 can also be electrically connected to the second connection electrode CE2, the first source electrode SE1 of the first transistor T1 and the second electrode 125 of the light emitting diode 120 which are connected to the second connection electrode CE2, through contact holes of the second interlayer insulating layer 114 and the adhesive layer 115.

The storage capacitor Cst stores a potential difference between the first gate electrode GE1 and the first source electrode SE1 of the first transistor T1 while the light emitting diode 120 emits light, so that a constant current can be supplied to the light emitting diode 120. The storage capacitor Cst is formed on the substrate 110, and includes the first capacitor electrode ST1 electrically connected to the first source electrode SE1, and further includes the second capacitor electrode ST2 which is electrically connected to the first gate electrode GE1 and is formed on the buffer layer 111, the gate insulating layer 112, and the first interlayer insulating layer 113. The storage capacitor Cst further includes the third capacitor electrode ST3 which is electrically connected to the first source electrode SE1 to store a voltage between the first gate electrode GE1 and the first source electrode SE1 of the first transistor T1.

The second interlayer insulating layer 114 is disposed on the second transistor T2, the third transistor T3, and the storage capacitor Cst. The second interlayer insulating layer 114 is an insulating layer which protects components below the second interlayer insulating layer 114, and can be configured by a single layer or a double layer of silicon oxide (SiOx) or silicon nitride (SiNx), but is not limited thereto.

The adhesive layer 115 is disposed on the second interlayer insulating layer 114. The adhesive layer 115 can planarize an upper portion of the substrate 110 on which the second transistor T2, the third transistor T3, the fourth transistor T4, and the storage capacitor Cst are disposed.

The adhesive layer 115 can serve as an adhesive layer 115 which temporarily fixes the light emitting diode 120 and the first transistor T1. For example, the adhesive layer 115 is formed of one of adhesive materials, such as adhesive polymer, epoxy resist, UV resin, polyimide based, acrylate based, urethane based, and poly dimethylsiloxane (PDMS), to fix the transferred light emitting diode 120 and the first transistor T1 onto the substrate 110, but is not limited thereto.

The light emitting diode 120 is disposed on the adhesive layer 115. The light emitting diode 120 is an element which emits light by a current, and can include a light emitting diode 120 which emits red light, green light, and blue light, and implements various colors of light including white by a combination thereof.

The light emitting diode 120 includes a first semiconductor layer 121, a light emitting layer 122, a second semiconductor layer 123, a first electrode 124, a second electrode 125, and a first passivation layer PAS1.

The first semiconductor layer 121 is disposed on the adhesive layer 115 and the second semiconductor layer 123 is disposed on the first semiconductor layer 121. The first semiconductor layer 121 and the second semiconductor layer 123 can be layers formed by doping n-type and p-type impurities into a specific material. For example, the first semiconductor layer 121 and the second semiconductor layer 123 can be layers formed by doping p-type and n-type impurities into a material, such as gallium nitride (GaN), indium aluminum phosphide (InAlP), or gallium arsenide (GaAs). The p-type impurity can be magnesium (Mg), zinc (Zn), and beryllium (Be), and the n-type impurity can be silicon (Si), germanium (Ge), and tin (Sn), but are not limited thereto.

A part of the first semiconductor layer 121 can be disposed to outwardly protrude from the second semiconductor layer 123. An upper surface of the first semiconductor layer 121 can be formed by a part overlapping a lower surface of the second semiconductor layer 123 and a part disposed outside of the lower surface of the second semiconductor layer 123 (e.g., portions of 121 can extend past 123). However, sizes and shapes of the first semiconductor layer 121 and the second semiconductor layer 123 can be modified in various forms, but are not limited thereto.

For example, the second semiconductor layer 123 is disposed in the middle of the upper surface of the first semiconductor layer 121 so that the entire second semiconductor layer 123 can overlap with the first semiconductor layer 121. The second semiconductor layer 123 is disposed inside the first semiconductor layer 121, and an edge of the second semiconductor layer 123 can be disposed at the inside from the edge of the first semiconductor layer 121. The first semiconductor layer 121 can outwardly protrude to the outside of the second semiconductor layer 123 from the entire edge of the second semiconductor layer 123. The first semiconductor layer 121 can outwardly protrude from the second semiconductor layer 123 in all directions. In this situation, the first semiconductor layer 121 is formed with a circular shape or an oval shape, and the second semiconductor layer 123 can be also formed with a circular shape or an oval shape, in the plan view. For example, the first semiconductor layer 121 and the second semiconductor layer 123 can both have circular or oval shapes, in which the second semiconductor layer 123 can have a smaller circular shape that is stacked on the first semiconductor layer 121 which can have a larger circular shape (e.g., similar to stacking a dime coin on a quarter coin).

The light emitting layer 122 is disposed between the first semiconductor layer 121 and the second semiconductor layer 123. The light emitting layer 122 is supplied with holes and electrons from the first semiconductor layer 121 and the second semiconductor layer 123 to emit light. The light emitting layer 122 can be formed by a single layer or a multi-quantum well (MQW) structure, and for example, can be formed of indium gallium nitride (InGaN) or gallium nitride (GaN), but is not limited thereto.

One or more first electrodes 124 are disposed on the first semiconductor layer 121. The first electrode 124 can be disposed on an upper surface of the first semiconductor layer 121 which is exposed from the light emitting layer 122 and the second semiconductor layer 123. The first electrode 124 is an electrode which electrically connects the first transistor T1, which is a driving transistor, and the first semiconductor layer 121. The first electrode 124 can be configured by a conductive material, for example, a transparent conductive material, such as indium tin oxide (ITO) or indium zinc oxide (IZO), or an opaque conductive material, such as titanium (Ti), gold (Au), silver (Ag), and copper (Cu), or an alloy thereof, but is not limited thereto.

For example, the first electrode 124, which is disposed on the upper surface of the circular or oval first semiconductor layer 121 in the plan view, can be disposed along the periphery of the first semiconductor layer 121 to be formed with the circular shape or the oval shape (e.g., the first electrode 124 can have a ring shape around the second semiconductor layer 123, but is not limited thereto). As another example, when the first semiconductor layer 121 has an oval shape in the plan view, the first electrode 124 can be partially disposed only at both edges of the first semiconductor layer 121 in a major axis direction.

At this time, the first electrode 124 can be disposed to be biased toward the outside of the light emitting diode 120 from a part of the upper surface of the first semiconductor layer 121 which is exposed from the light emitting layer 122 and the second semiconductor layer 123. The first electrode 124 is disposed as far away as possible from the second semiconductor layer 123 on which the second electrode 125 is disposed to reduce an etching margin when the first electrode 124 is formed. For example, a conductive layer which covers the first semiconductor layer 121, the light emitting layer 122, and the second semiconductor layer 123 is formed and etched to form the first electrode 124 and the second electrode 125. During this process, a formation position of the first electrode 124 is designed as an area far away from the second electrode 125 and the second semiconductor layer 123. For example, the first electrode 124 is spaced apart from the second electrode 125 and the second semiconductor layer 123. Accordingly, even when the process error is caused during the formation of the first electrode 124, formation of the first electrode 124 on the second semiconductor layer 123 is reduced.

Further, the first electrode 124 is disposed as far away as possible from the second semiconductor layer 123 on which the second electrode 125 is disposed, and in this way, an area of the light emitting layer 122 can be increased. When the first electrode 124 is disposed to be adjacent to the outside of the light emitting diode 120, the light emitting layer 122 can be formed in the remaining area in which the first electrode 124 is not located, and the area of the light emitting layer 122 can be increased. If the first electrode 124 is disposed to be closer to the center of the light emitting diode 120, an area in which the light emitting layer 122 can be disposed is reduced so that the luminous efficiency of the light emitting diode 120 may be degraded. Accordingly, the first electrode 124 is disposed to be adjacent to the outside of the light emitting diode 120 to increase the area and the luminous efficiency of the light emitting layer 122. For example, the first electrode 124 is disposed along an outer edge of the light emitting diode 120, in order to make more room for the light emitting layer 122.

For example, the first electrode 124 can disposed on both sides of the second semiconductor layer 123 at locations far away from the second semiconductor layer 123. The first electrode 124 disposed at a left side of the second semiconductor layer 123 can be biased toward or closer to the left side from the upper surface of the exposed first semiconductor layer 121, and can be closer to the outside of the light emitting diode 120 than the second semiconductor layer 123. The first electrode 124 disposed at a right side of the second semiconductor layer 123 can be biased toward or closer to the right side from the upper surface of the exposed first semiconductor layer 121, and can be closer to the outside of the light emitting diode 120 than the second semiconductor layer 123.

The second electrode 125 is disposed on the second semiconductor layer 123. The second electrode 125 can be disposed on the upper surface of the second semiconductor layer 123. The second electrode 125 is an electrode which electrically connects the low potential power line VSS and the second semiconductor layer 123. The second electrode 125 can be configured by a transparent conductive material, such as indium tin oxide (ITO) or indium zinc oxide (IZO), or an opaque conductive material, such as titanium (Ti), gold (Au), silver (Ag), and copper (Cu), or an alloy thereof, but is not limited thereto. Accordingly, the light emitting diode 120 can be a lateral light emitting diode 120 in which the first electrode 124 and the second electrode 125 are horizontally disposed.

Next, the first passivation layer PAS1 which encloses the first semiconductor layer 121, the light emitting layer 122, the second semiconductor layer 123, the first electrode 124, and the second electrode 125 is disposed. The first passivation layer PAS1 is formed of an insulating material to protect the first semiconductor layer 121, the light emitting layer 122, and the second semiconductor layer 123. In the first passivation layer PAS1, contact holes are formed which expose the first electrode 124 and the second electrode 125 to electrically connect the first electrode 124 and the second electrode 125 to the first connection electrode CE1 and the second connection electrode CE2, which will be formed later.

In the meantime, in the specification, it has been described that the light emitting diode 120 includes the first semiconductor layer 121, the light emitting layer 122, the second semiconductor layer 123, the first electrode 124, the second electrode 125, and the first passivation layer PAS1. However, the first passivation layer PAS1 can be omitted in the light emitting diode 120 depending on the design, but is not limited thereto.

Next, the first transistor T1 is disposed on the adhesive layer 115. The first transistor T1 includes the first gate electrode GE1, the first source electrode SE1, the first drain electrode DE1, a first channel formation layer SCL1, a second channel formation layer SCL2, and a second passivation layer PAS2.

First, the first channel formation layer SCL1 is disposed on the adhesive layer 115, and the second channel formation layer SCL2 is formed on the first channel formation layer SCL1. The first channel formation layer SCL1 and the second channel formation layer SCL2 can be formed of semiconductor layers having different polarizability and energy band gaps. The first channel formation layer SCL1 and the second channel formation layer SCL2 are bonded to each other to form a hetero junction structure and form a two-dimensional electron gas (2DEG) layer. The first channel formation layer SCL1 and the second channel formation layer SCL2, which different energy band gaps, can form a 2DEG layer having a high electron mobility and a carrier concentration at a bonding interface due to the band discontinuity at the bonding interface. Accordingly, the 2DEG layer formed in the vicinity of the bonding interface of the first channel formation layer SCL1 and the second channel formation layer SCL2 can serve as a channel to allow current to flow between the first source electrode SE1 and the first drain electrode DE1. Accordingly, unlike the second transistor T2, the third transistor T3, and the fourth transistor T4 which are thin film transistors, the first transistor T1 can be a high electron mobility transistor (HEMT) because the first transistor T1 uses the 2DEG layer formed by bonding the first channel formation layer SCL1 and the second channel formation layer SCL2 as a channel.

The first channel formation layer SCL1 and the second channel formation layer SCL2 can be formed of a group III-V compound material. For example, the first channel formation layer SCL1 is formed of gallium nitride (GaN) and the second channel formation layer SCL2 can be formed of aluminum gallium nitride (AlGaN), but is not limited thereto.

The first source electrode SE1 and the first drain electrode DE1 are disposed on the second channel formation layer SCL2 and spaced apart from each other. The first source electrode SE1 and the first drain electrode DE1 can be configured by a conductive material, such as copper (Cu), aluminum (Al), molybdenum (Mo), nickel (Ni), titanium (Ti), and chrome (Cr), or an alloy thereof, but are not limited thereto.

The second passivation layer PAS2 is disposed on and encloses the first source electrode SE1, the first drain electrode DE1, the first channel formation layer SCL1, and the second channel formation layer SCL2. The second passivation layer PAS2 is formed of an insulating material to protect the first channel formation layer SCL1 and the second channel formation layer SCL2. The second passivation layer PAS2 can serve as a sort of gate insulating layer which insulates the first source electrode SE1 and the first drain electrode DE1 from the first gate electrode GE1. In the second passivation layer PAS2, a contact hole is formed, which exposes the first source electrode SE1 and the first drain electrode DE1, to electrically connect the first source electrode SE1 and the first drain electrode DE1 to the second connection electrode CE2 and the fourth connection electrode CE4, which will be formed later.

The first gate electrode GE1 is disposed between the first source electrode SE1 and the first drain electrode DE1 on the second passivation layer PAS2. The first gate electrode GE1 can be configured by a conductive material, such as copper (Cu), aluminum (Al), molybdenum (Mo), nickel (Ni), titanium (Ti), and chrome (Cr), or an alloy thereof, but is not limited thereto.

The first connection electrode CE1, the second connection electrode CE2, the third connection electrode CE3, and the fourth connection electrode CE4 are disposed on the light emitting diode 120 and the first transistor T1.

Referring to FIG. 5A, the first connection electrode CE1 is an electrode for electrically connecting the first electrode 124 or the first semiconductor layer 121 of the light emitting diode 120 with the low potential power line VSS. The first connection electrode CE1 is electrically connected to the first electrode 124 of the light emitting diode 120 exposed from the first passivation layer PAS1, and can be electrically connected to the low potential power line VSS exposed through the contact hole in the adhesive layer 115 and the second interlayer insulating layer 114.

Referring to FIG. 5B, the second connection electrode CE2 is an electrode which electrically connects the first electrode 124 or the second semiconductor layer 123 of the light emitting diode 120, the first source electrode SE1 of the first transistor T1, the third capacitor electrode ST3, the first capacitor electrode ST1, and the fourth drain electrode DE4. The second connection electrode CE2 is electrically connected to the second electrode 125 of the light emitting diode 120 through the contact hole formed in the first passivation layer PAS1, and can be electrically connected to the first source electrode SE1 of the first transistor T1 through the contact hole formed in the second passivation layer PAS2. The second connection electrode CE2 can be electrically connected to the third capacitor electrode ST3 through the contact hole in the adhesive layer 115 and the second interlayer insulating layer 114. At this time, the third capacitor electrode ST3 is integrally formed with the fourth drain electrode DE4 to be electrically connected to the first capacitor electrode ST1 through the contact hole of the first interlayer insulating layer 113 and the buffer layer 111 adjacent to the fourth drain electrode DE4. Accordingly, the second connection electrode CE2 can electrically connect the third capacitor electrode ST3, the first capacitor electrode ST1, and the fourth drain electrode DE4 to the first electrode 124.

Referring to FIG. 4, the third connection electrode CE3 is an electrode which electrically connects the first gate electrode GE1 of the first transistor T1 to the third source electrode SE3 and the second source electrode SE2. The third connection electrode CE3 can be electrically connected to the third source electrode SE3 through the contact hole formed in the adhesive layer 115 and the second interlayer insulating layer 114. At this time, referring to FIGS. 4 and 5B together, the third source electrode SE3 is electrically connected to the second capacitor electrode ST2 through the contact hole formed in the first interlayer insulating layer 113. The second capacitor electrode ST2 can be electrically connected to the second source electrode SE2 through the contact hole formed in the first interlayer insulating layer 113 again. Accordingly, the first gate electrode GE1 can be electrically connected to the third source electrode SE3, the second capacitor electrode ST2, and the second source electrode SE2 through the third connection electrode CE3.

Finally, referring to FIG. 5B, the fourth connection electrode CE4 is an electrode for electrically connecting the high potential power line VDD and the first drain electrode DE1. The fourth connection electrode CE4 is electrically connected to the first drain electrode DE1 of the first transistor T1 exposed from the second passivation layer PAS2, and can be electrically connected to the high potential power line VDD through the contact hole in the adhesive layer 115 and the second interlayer insulating layer 114.

However, in the present specification, even though it has been described that only the first transistor T1 is a high electron mobility transistor, other transistors can also be formed as high electron mobility transistors, but is not limited thereto.

Further, in the present specification, even though it has been described that the first transistor T1 is a high electron mobility transistor, the first transistor T1 can be formed by any one of semiconductor devices transferrable by a self-assembling method, as well as a high electron mobility transistor. For example, the first transistor can be formed of a semiconductor device, such as a metal-oxide semiconductor field effect transistor (MOSFET) formed by doping n-type or p-type impurities into silicon.

In the meantime, the light emitting diode 120 is a current driving type micro LED to supply high current to display an image with a high luminance. At this time, when the first transistor T1 (e.g., which is a driving transistor) which controls a driving current is formed as a thin film transistor, like the other transistors, in order to supply a high driving current, a width of the channel needs to be increased for high current. However, due to the insufficient design space for increasing the channel width, options are limited for increasing the channel width of the first transistor T1 and it may be difficult to supply a high current to the light emitting diode 120.

Accordingly, in the display device 100 according to the example embodiment of the present disclosure, the first transistor T1 is configured by a high electron mobility transistor (HEMT) to improve the reliability, and a design area of the first transistor T1 is minimized to implement a high resolution (e.g., the HEMT transistor saves space and provides high current). The first transistor T1 which controls a driving current supplied to the light emitting diode 120 can be formed by a high electron mobility transistor having a high electron mobility. In this situation, the first transistor T1 has an electron mobility higher than that of a normal oxide thin film transistor so that the high current can be supplied to the light emitting diode 120 without increasing a channel width of the first transistor T1. Further, the first transistor T1 is not disposed on the buffer layer 111 like the other transistors, but is disposed on the adhesive layer 115 to minimize a lateral design area which is increased by the first transistor T1. Accordingly, in the display device 100 according to the example embodiment of the present disclosure, the first transistor T1 which controls the driving current is formed by the high electron mobility transistor to display an image with a high luminance. Further, a design area due to the first transistor T1 is minimized to improve the resolution.

Further, in the display device 100 according to the example embodiment of the present disclosure, the first transistor T1 and the light emitting diode 120 can be transferred onto the substrate 110 by a self-assembling method. The first transistor T1 and the light emitting diode 120 each include a semiconductor material, such as gallium nitride, which is dielectrically polarized by the electric field to have a polarity. Accordingly, the light emitting diode 120 and the first transistor T1 can move or be fixed in a specific direction by the electric field, and the first transistor T1 and the light emitting diode 120 can be easily transferred onto the display device 100 using this characteristic. In order words, a strong electric field can be used to automatically align the light emitting diode 120 and the first transistor T1 into the correct positions.

Hereinafter, a manufacturing method of a display device 100 according to an example embodiment of the present disclosure will be described with reference to FIGS. 6A to 6F.

FIGS. 6A to 6F are process charts for explaining a self-assembling method of a light emitting diode and a first transistor of a display device according to the example embodiment of the present disclosure.

Figure 6A:
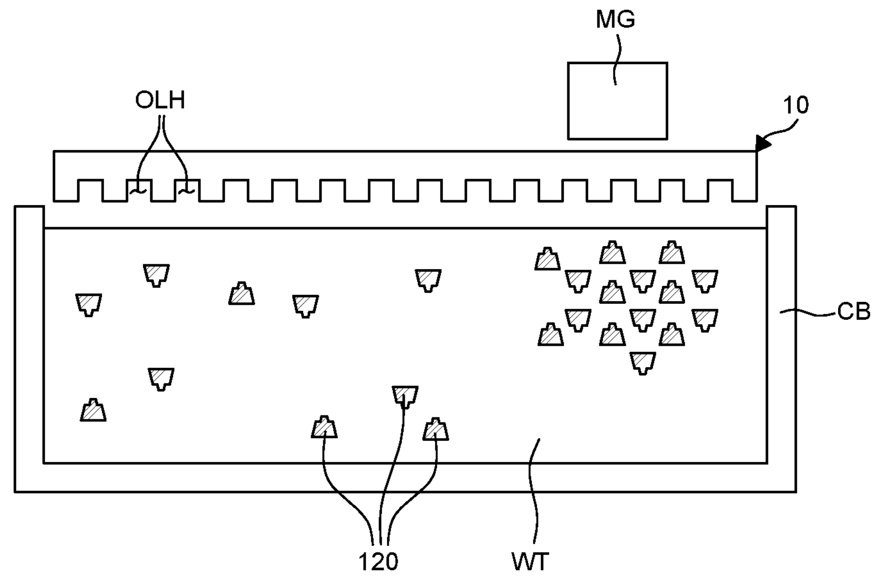
FIGS. 6A to 6F are process charts for explaining a self-assembling method of a light emitting diode and a first transistor of a display device according to the embodiment of the present disclosure.

First, referring to FIG. 6A, the light emitting diode 120 is put into a chamber CB filled with a fluid WT. The fluid WT can include water and the chamber CB filled with the fluid WT can have an open-top shape.

Next, an assembling substrate 10 can be located on or over the chamber CB filled with the light emitting diodes 120. The assembling substrate 10 is a substrate which temporarily self-assembles the light emitting diode 120 and the first transistor T1. After self-assembling the light emitting diode 120 and the first transistor T1 on the assembling substrate 10, the light emitting diode 120 and the first transistor T1 on the assembling substrate 10 can be transferred onto the display device 100.

Next, a magnet MG can be located on the assembling substrate 10. The light emitting diodes 120 sinking on the bottom of the chamber CB or floating can move toward the assembling substrate 10 by a magnetic force of the magnet MG.

At this time, the light emitting diodes 120 can include magnetic materials so they can be moved by the magnetic field. For example, any one of the first electrode 124 and the second electrode 125 of each of the light emitting diodes 120 includes a ferromagnetic material, such as iron or cobalt, to align the direction of the light emitting diodes 120 which are directed to the magnet MG.

Next, the light emitting diodes 120 which move toward the assembling substrate 10 by the magnet MG can be self-assembled onto the assembling substrate 10 by an electric field formed by a plurality of assembly lines AL.

Figure 6B:
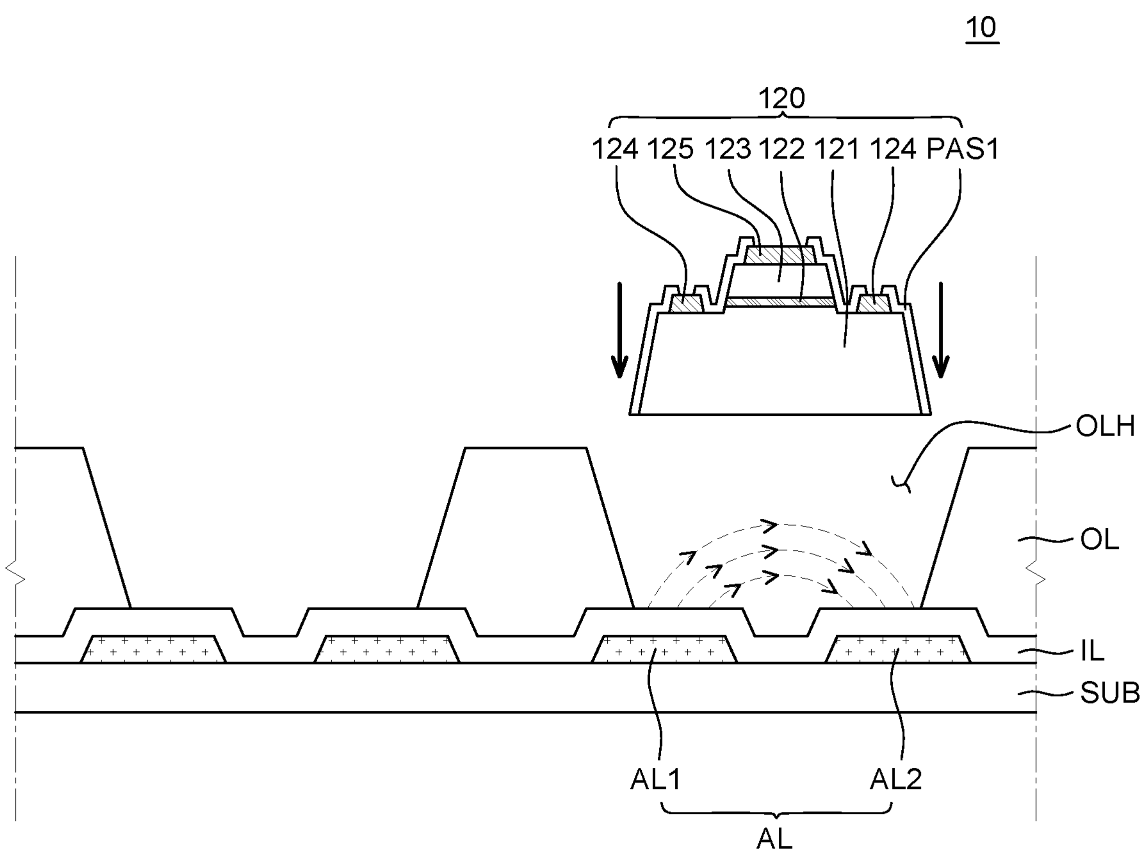

Specifically, referring to FIG. 6B, the assembling substrate 10 includes an assembly substrate (basis assembly substrate) SUB, a plurality of assembly lines AL, an assembly insulating layer IL, and an organic layer OL.

First, a plurality of assembly lines AL are disposed on the assembly substrate SUB. The plurality of assembly lines AL include a plurality of first assembly lines AL1 and a plurality of second assembly lines AL2. The plurality of first assembly lines AL1 and the plurality of second assembly lines AL2 can be spaced apart from each other with a predetermined interval or by a predetermined distance.

The assembly insulating layer IL is disposed on the plurality of assembly lines AL. The assembly insulating layer IL protects the plurality of assembly lines AL from the fluid WT to suppress any defects from forming, such as corrosion of the plurality of assembly lines AL.

An organic layer OL including a plurality of pockets OLH is disposed on the assembly insulating layer IL. Each of the plurality of pockets OLH formed by an opening in the organic layer OL is an area in which one of the plurality of light emitting diodes 120 is self-assembled. The plurality of pockets OLH can be disposed to overlap an area between one pair of the first assembly line AL1 and the second assembly line AL2. Each of the plurality of pockets OLH can be formed in a position corresponding to one of the plurality of sub pixels SP of the display device 100, thereafter. Each of the plurality of pockets OLH can be disposed to correspond to the plurality of sub pixels SP in a one-to-one manner, and the light emitting diode 120 and the first transistor T1, which are self-assembled in the plurality of pockets OLH, can be transferred onto the plurality of sub pixels SP.

A voltage is applied to the plurality of assembly lines AL to self-assemble the plurality of light emitting diodes 120 in the pocket OLH of the organic layer OL. For example, an AC voltage is applied to the plurality of first assembly lines AL1 and the plurality of second assembly lines AL2 to form an electric field. The light emitting diode 120 is dielectrically polarized by the electric field to have a polarity. The dielectrically polarized light emitting diode 120 can move toward or can be fixed to a specific direction by dielectrophoresis (DEP), that is, an electric field. Accordingly, the plurality of light emitting diodes 120 can be temporarily self-assembled in the pocket OLH of the assembling substrate 10 and held in place using dielectrophoresis.

Figure 6C:
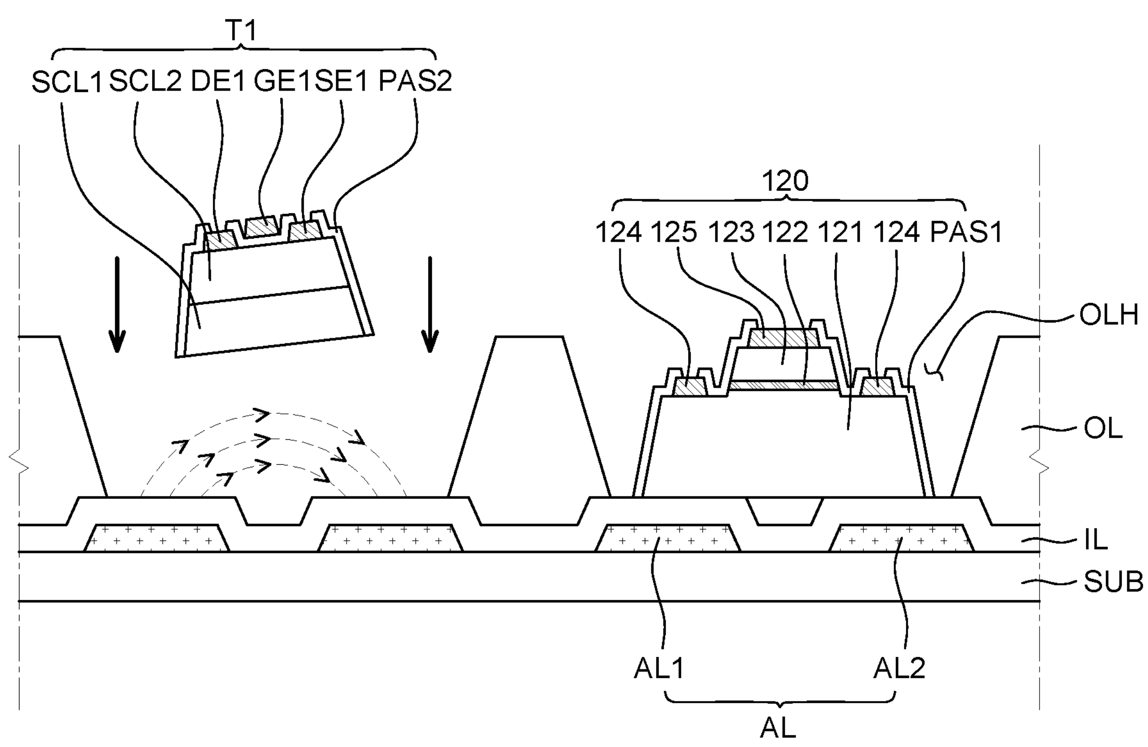

Next, referring to FIG. 6C, the first transistor T1 can be self-assembled in the assembling substrate 10, similar to how the light emitting diode 120 was self-assembled. The first transistors T1 are put into the chamber CB and the assembling substrate 10 can be located on or over the chamber CB. The first transistors T1 are aligned in a specific direction using the magnet MG to move to the assembling substrate 10. At this time, in order to move each of the first transistors T1 by the magnetic field, any one of the first source electrode SE1, the first drain electrode DE1, and the first gate electrode GE1 can include a magnetic material. Finally, as illustrated in FIG. 6C, the first transistors T1 can be self-assembled on the assembling substrate 10 using an electric field of the assembly line AL.

At this time, the light emitting diode 120 and the first transistor T1 can be located in the same chamber CB or can be located in different chambers CB to be individually self-assembled in separate steps. Further, even though it is illustrated that the light emitting diode 120 and the first transistor T1 are self-assembled together on one assembling substrate 10, the light emitting diode 120 and the first transistor T1 can be self-assembled on different assembling substrates 10, but are not limited thereto.

Figure 6D:
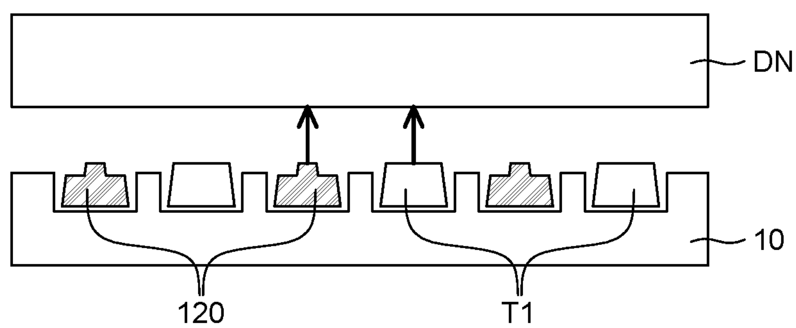

Next, referring to FIG. 6D, the plurality of light emitting diodes 120 and the first transistors T1 of the assembling substrate 10 are transferred onto a donor DN.

First, the assembling substrate 10 and the donor DN are aligned such that the plurality of light emitting diodes 120 and the plurality of first transistors T1 face the donor DN. The assembling substrate 10 and the donor DN are bonded so that upper portions of the light emitting diode 120 and the first transistor T1 can be in contact with the donor DN. At this time, the donor DN is formed of a material having adhesiveness so that upper portions of the plurality of light emitting diodes 120 and the first transistor T1 are adhered to the donor DN to be transferred from the assembling substrate 10 to the donor DN. The donor DN can be configured by a polymer material having viscoelasticity, for example, poly dimethyl siloxane (PDMS), poly urethane acrylate (PUA), polyethylene glycol (PEG), polymethylmethacrylate (PMMA), polystyrene (PS), epoxy resin, urethane resin, or acrylic resin, but is not limited thereto.

Figure 6E:
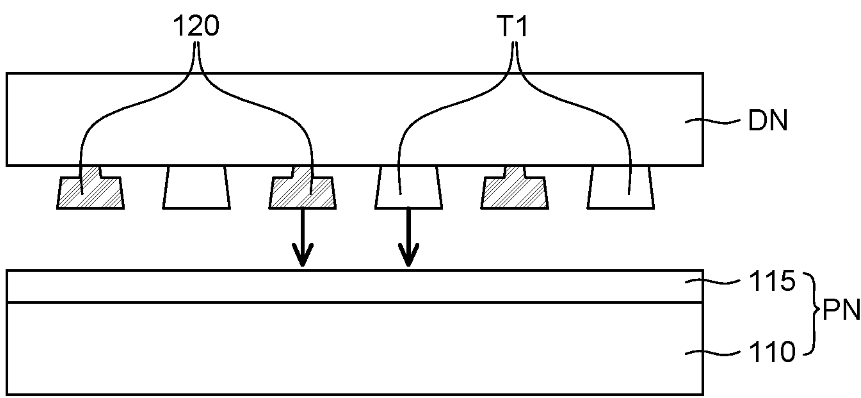

Next, referring to FIG. 6E, the plurality of light emitting diodes 120 and the first transistors T1 on the donor DN are transferred onto the adhesive layer 115 of the display device 100.

The display device 100 formed up to the adhesive layer 115 and the donor DN can be aligned with each other. The display device 100 and the donor DN can be aligned such that the plurality of light emitting diodes 120 and the first transistors T1 of the donor DN face the adhesive layer 115 of the display device 100. The donor DN and the display device 100 are bonded to transfer the light emitting diodes 120 and the first transistors T1 from the donor DN onto the adhesive layer 115 of the display device 100.

Figure 6F:
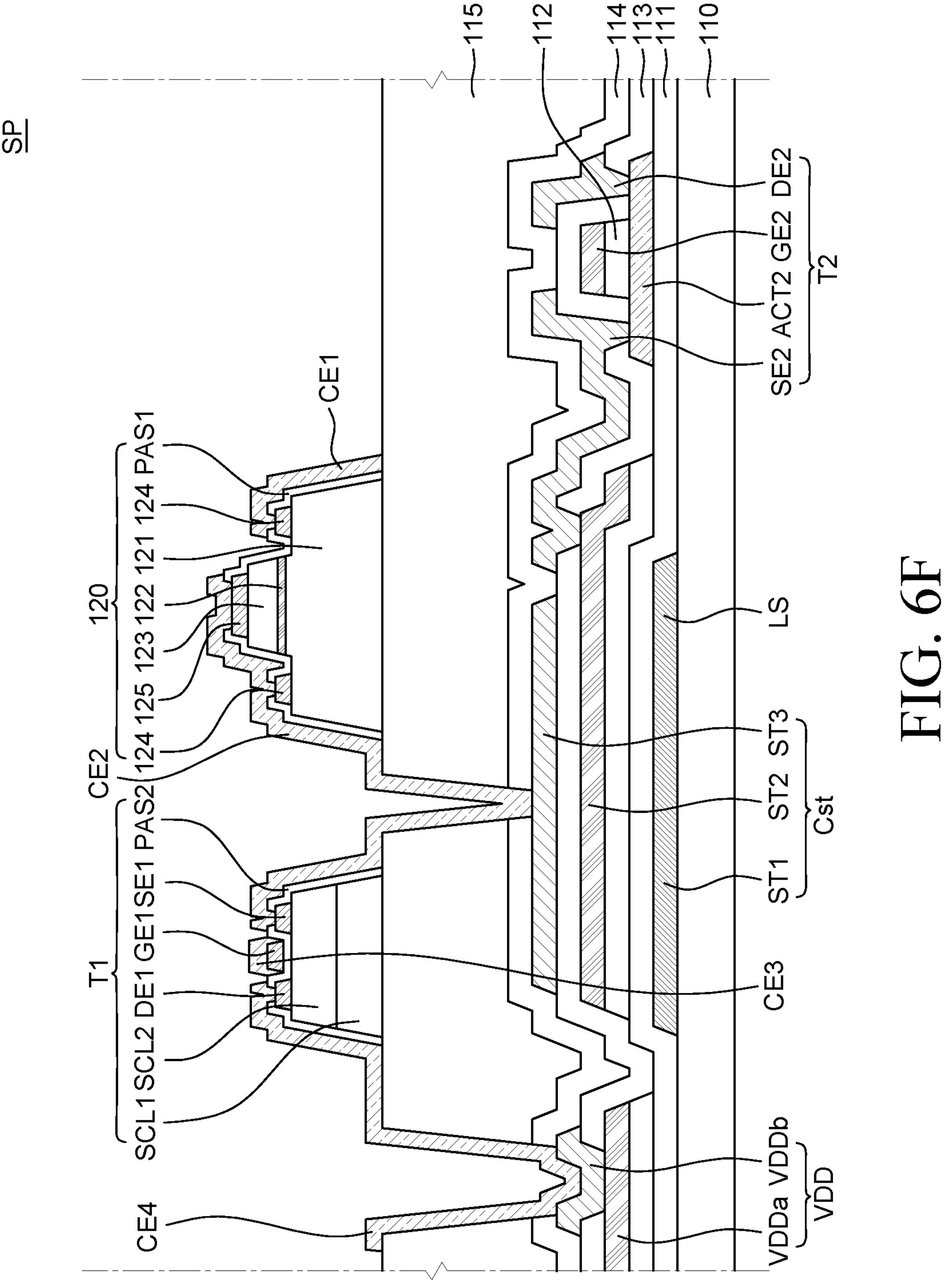

Finally, referring to FIG. 6F, after the light emitting diodes 120 and the first transistors T1 have been transferred from the donor DN to the display device 100, the first connection electrode CE1, the second connection electrode CE2, the third connection electrode CE3, and the fourth connection electrode CE4 are formed on the light emitting diode 120 and the first transistor T1, which securely fixes the light emitting diodes 120 and the first transistors T1 into their final positions. Accordingly, the light emitting diode 120 and the first transistor T1 can be electrically connected to the low potential power line VSS, the high potential power line VDD, the second transistor T2, the third transistor T3, the fourth transistor T4, and the storage capacitor Cst.

Accordingly, in the display device 100 and the manufacturing method of the display device 100, according to the example embodiment of the present disclosure, the light emitting diodes 120 and the first transistors T1 are self-assembled to be transferred onto the display device 100. By doing this, the process is simplified and reliability is improved. The light emitting diodes 120 and the first transistors T1 can be self-assembled in the pockets OLH of the assembling substrate 10 using the electric field. At this time, the pocket OLH is formed to correspond to an area of one of the plurality of sub pixels SP in which the light emitting diode 120 and the first transistor T1 are disposed. Therefore, when the light emitting diode 120 and the first transistor T1 are self-assembled in the pockets OLH, a process of precisely or individually aligning the light emitting diodes 120 and the first transistors T1 can be omitted. If a direct-transferring method is used instead of the self-assembling method, a process of precisely aligning between a wafer and a donor DN, and between the donor DN and the display device 100 is necessary, and an alignment accuracy of the light emitting diode 120 and the first transistor T1 may be deteriorated due to a process error, which may result in lower yields. In contrast, in the display device 100 and the manufacturing method of the display device 100, according to the example embodiment of the present disclosure, the light emitting diodes 120 and the first transistors T1 are aligned and transferred using the self-assembling method using an electric field. By doing this, the aligning process can be simplified and reliability can be improved.

Figure 7:
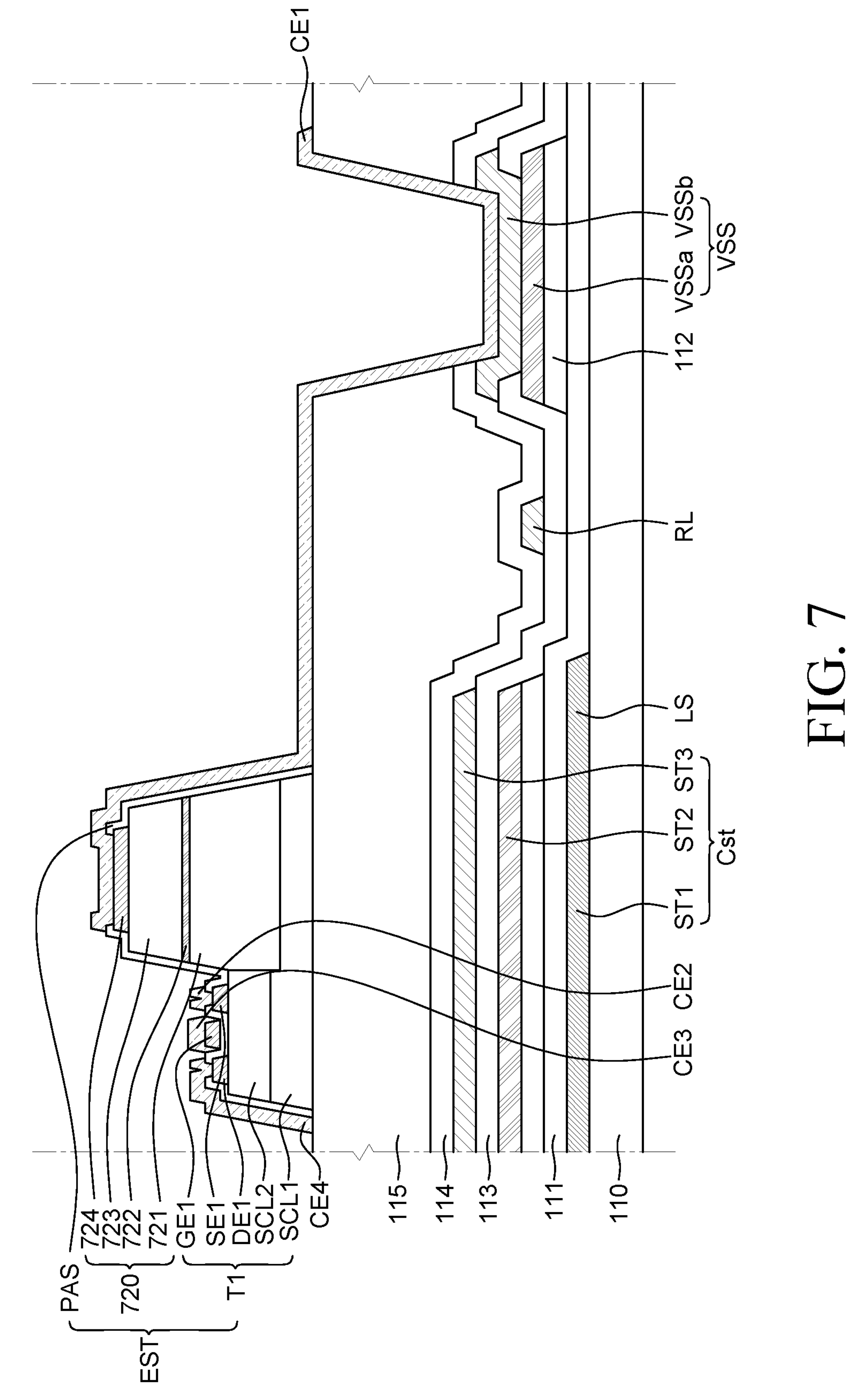
FIG. 7 is a cross-sectional view of a display device according to another embodiment of the present disclosure.
Figure 8:
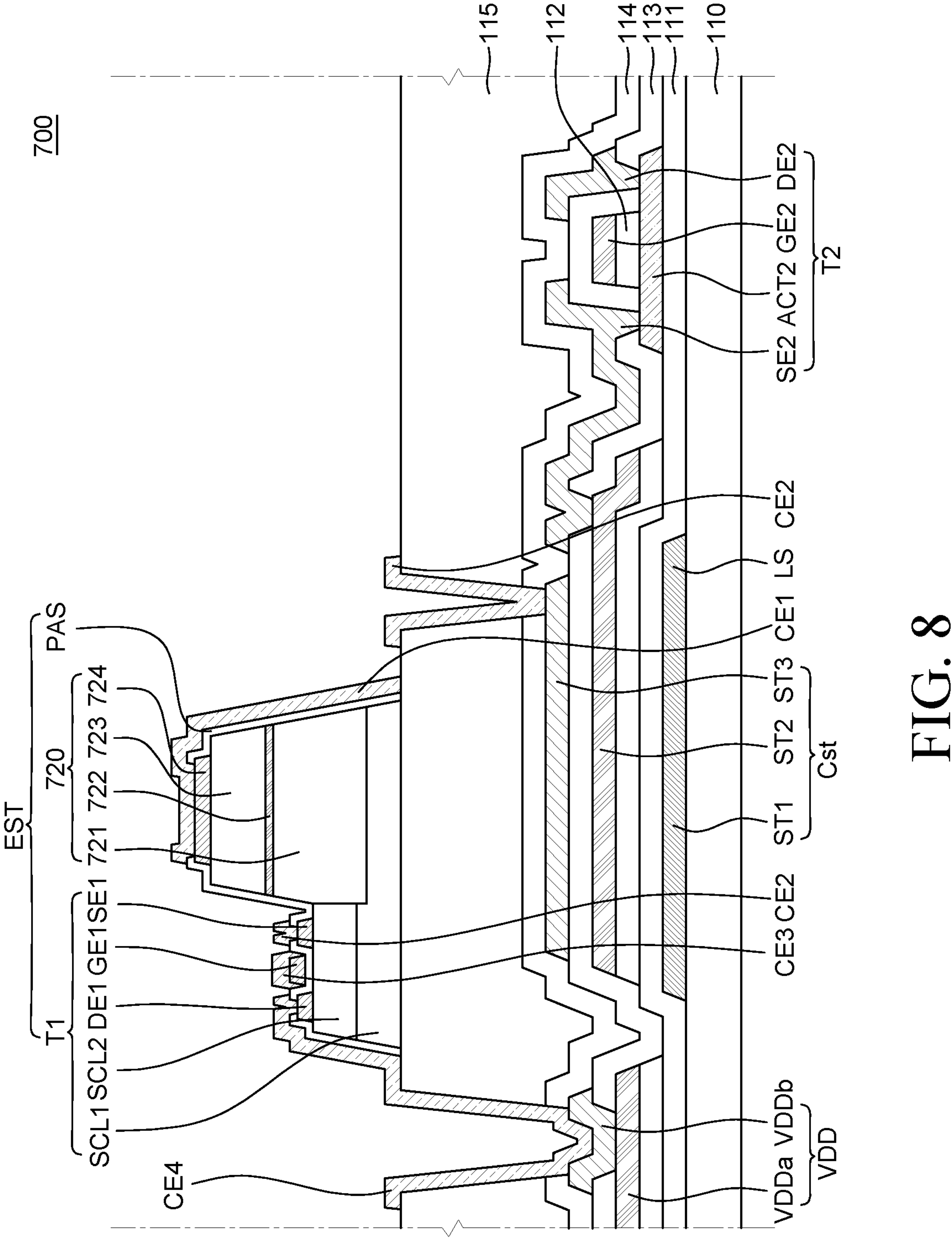
FIG. 8 is a cross-sectional view of a display device according to another embodiment of the present disclosure.

FIG. 7 is a cross-sectional view of a display device according to another example embodiment of the present disclosure. FIG. 8 is a cross-sectional view of a display device according to another example embodiment of the present disclosure. The only difference between a display device 700 of FIGS. 7 and 8 and the display device 100 of FIGS. 1 to 5B is a light emitting diode 720 and a first transistor T1, but the other configurations are substantially the same, so that a redundant description will be omitted. For example, in display device 700 of FIGS. 7 and 8, a light emitting diode 720 and a first transistor T1 are integrally formed together as one unit, which can further improve the assembly process and save space.

Referring to FIGS. 7 and 8, an emission structure EST is disposed on the adhesive layer 115. The emission structure EST includes the light emitting diode 720, the first transistor T1, and the passivation layer PAS. The light emitting diode 720 and the first transistor T1 of the emission structure EST can be at least partially in contact with each other and integrally formed. That is, one light emitting diode 720 and one first transistor T1 which are integrally formed together and can form one emission structure EST.

First, the first transistor T1 includes a first channel formation layer SCL1, a second channel formation layer SCL2, a first gate electrode GE1, a first source electrode SE1, and a first drain electrode DE1.

The first channel formation layer SCL1 can be formed to extend to a lower side of the light emitting diode 720 (e.g., to electrically connect to the first semiconductor layer 721). The light emitting diode 720 can be disposed on the first channel formation layer SCL1 (e.g., the first channel formation layer SCL1 can extend across and underneath both of the light emitting diode 720 and the first transistor T1). The first channel formation layer SCL1 can include a part extending to the outside of the second channel formation layer SCL2 and the light emitting diode 720 can be disposed on the extending part of the first channel formation layer SCL1. The second channel formation layer SCL2 is disposed in a remaining area of the first channel formation layer SCL1 in which the light emitting diode 720 is not disposed. At this time, side surfaces of the first channel formation layer SCL1 and the second channel formation layer SCL2 can be in contact with the first semiconductor layer 721 of the light emitting diode 720. Accordingly, a 2DEG layer which is formed in the vicinity of a bonding interface of the first channel formation layer SCL1 and the second channel formation layer SCL2 and serves as a channel through which a current flow is in contact with the first semiconductor layer 721 of the light emitting diode 720. By doing this, the current can be supplied to the light emitting diode 720.

The first source electrode SE1 and the first drain electrode DE1, which are spaced apart from each other, are disposed on the second channel formation layer SCL2, and a passivation layer PAS is disposed on the first source electrode SE1 and the first drain electrode DE1. Further, the first gate electrode GE1 is disposed on the passivation layer PAS. At this time, the first source electrode SE1 can be located closer to the light emitting diode 720, or to the side surface of the first semiconductor layer 721 of the light emitting diode 720 than the first drain electrode DE1. Accordingly, the first transistor T1 can be formed, which includes the first gate electrode GE1, the first source electrode SE1, and the first drain electrode DE1, the first channel formation layer SCL1, and the second channel formation layer SCL2.

Next, the light emitting diode 720 includes a first semiconductor layer 721, a light emitting layer 722, a second semiconductor layer 723, and a contact electrode 724.

The first semiconductor layer 721 is disposed on the first channel formation layer SCL1, and the light emitting layer 722, the second semiconductor layer 723, and the contact electrode 724 are sequentially disposed on the first semiconductor layer 721. At this time, the light emitting diode 720 can be a vertical light emitting diode 720 in which the driving current flows in a vertical direction of the light emitting layer 722.

At this time, a side surface of the first semiconductor layer 721 is connected to a channel formed in the vicinity of a bonding interface of the first channel formation layer SCL1 and the second channel formation layer SCL2 to be supplied with a driving current. The side surface of the first transistor T1 corresponding to the bonding interface of the first channel formation layer SCL1 and the second channel formation layer SCL2 can be in contact with the side surface of the first semiconductor layer 721. To this end, a thickness of a part of the first channel formation layer SCL1 overlapping the second channel formation layer SCL2 can be larger than a thickness of the remaining part of the first channel formation layer SCL1 overlapping the first semiconductor layer 721 or the light emitting diode 720. That is, a thickness of the first channel formation layer SCL1 in which the first semiconductor layer 721 is disposed can be smaller than a thickness of the first channel formation layer SCL1 below the second channel formation layer SCL2. Therefore, the thickness of the first channel formation layer SCL1 corresponding to the light emitting diode 720 is formed to be smaller so that the emission structure EST can be formed such that the channel of the first transistor T1 is in contact with the side surface of the first semiconductor layer 721 (e.g., the channel of the first transistor T1 electrically connects to the side of the first semiconductor layer 721 in the light emitting diode 720). Any one of the first semiconductor layer 721 and the second semiconductor layer 723 can be electrically connected to the first transistor T1. Further, the driving current can be transmitted from the first transistor T1 to the light emitting diode 720.

The first transistor T1 and the light emitting diode 720 of the emission structure EST can be formed by growing a semiconductor material on the same wafer. The first channel formation layer SCL1 of the first transistor T1 is formed on the front surface of the wafer, and each of the second channel formation layer SCL2 and the light emitting diode 720 can be formed thereon.

For example, the first channel formation layer SCL1 and the second channel formation layer SCL2 are formed on the front surface of the wafer, and a part of the second channel formation layer SCL2 can be removed. The first semiconductor layer 721, the light emitting layer 722, and the second semiconductor layer 723 of the light emitting diode 720 are sequentially grown in an area from which the second channel formation layer SCL2 is removed, and are patterned into a plurality of parts to form a plurality of emission structures EST.

At this time, the first channel formation layer SCL1 on which the first semiconductor layer 721 is formed can serve as a sort of a buffer layer or as a type of substrate layer. The first channel formation layer SCL1 can relieve a lattice mis-match of the first semiconductor layer 721 and the second semiconductor layer 723 during a process of growing the first semiconductor layer 721, the light emitting layer 722, and the second semiconductor layer 723 on the wafer to relieve the stress. For example, the first channel formation layer SCL1 can be formed of gallium nitride (GaN), but is not limited thereto.

The passivation layer PAS can be disposed to enclose at least a part of the first transistor T1 and the light emitting diode 720. The passivation layer PAS can be disposed to cover at least a part of the first source electrode SE1, the first drain electrode DE1, the first channel formation layer SCL1, and the second channel formation layer SCL2 of the first transistor T1. The passivation layer PAS can be disposed to cover at least a part of the first semiconductor layer 721, the light emitting layer 722, the second semiconductor layer 723, and the contact electrode 724 of the light emitting diode 720.

Accordingly, together the first transistor T1, the light emitting diode 720, and the passivation layer PAS can form one emission structure EST. The emission structure EST is electrically connected to the remaining circuit configurations of the plurality of sub pixels SP through the first connection electrode CE1, the second connection electrode CE2, the third connection electrode CE3, and the fourth connection electrode CE4 to be driven. The remaining circuit configurations include the second transistor T2, the third transistor T3, the fourth transistor T4, the storage capacitor Cst, the high potential power line VDD, and the low potential power line VSS.

Specifically, the first connection electrode CE1 can electrically connect the contact electrode 724 of the emission structure EST and the low potential power line VSS. The first connection electrode CE1 is electrically connected to the contact electrode 724 through the contact hole of the passivation layer PAS, and can be electrically connected to the low potential power line VSS through the adhesive layer 115 and the second interlayer insulating layer 114.

The second connection electrode CE2 is an electrode which electrically connects the first source electrode SE1 and the first semiconductor layer 721 of the light emitting diode 720 to the third capacitor electrode ST3, the first capacitor electrode ST1, and the fourth drain electrode DE4. The third capacitor electrode ST3 is integrally formed with the fourth drain electrode DE4, and the third capacitor electrode ST3 is electrically connected to the first capacitor electrode ST1 through the contact hole of the buffer layer 111 and the first interlayer insulating layer 113. Therefore, the second connection electrode CE2 is connected to the third capacitor electrode ST3 through the contact hole in the adhesive layer 115 and the second interlayer insulating layer 114 to electrically connect the first source electrode SE1, the first semiconductor layer 721, the third capacitor electrode ST3, the first capacitor electrode ST1, and the fourth drain electrode DE4 to each other.

The third connection electrode CE3 is an electrode which electrically connects the first gate electrode GE1 of the first transistor T1, the second capacitor electrode ST2, the third source electrode SE3, and the second source electrode SE2. The third connection electrode CE3 can be electrically connected to the third source electrode SE3 through the contact hole formed in the adhesive layer 115 and the second interlayer insulating layer 114. The third source electrode SE3 is electrically connected to the second capacitor electrode ST2, and the second capacitor electrode ST2 is electrically connected to the second source electrode SE2 through the contact hole formed in the first interlayer insulating layer 113. Accordingly, the first gate electrode GE1 can be electrically connected to the second capacitor electrode ST2, the third source electrode SE3, and the second source electrode SE2 through the third connection electrode CE3.

Finally, the fourth connection electrode CE4 is an electrode for electrically connecting the high potential power line VDD and the first drain electrode DE1. The fourth connection electrode CE4 is electrically connected to the first drain electrode DE1 of the first transistor T1 exposed from the passivation layer PAS, and can be electrically connected to the high potential power line VDD through the contact hole in the adhesive layer 115 and the second interlayer insulating layer 114.

At this time, the emission structure EST of the display device 700 according to another example embodiment of the present disclosure also includes a semiconductor material which is dielectrically polarized by the electric field to be formed by a self-assembling method. The emission structure EST is put into a chamber CB illustrated in FIG. 6A, and can be self-assembled in the pocket OLH of the assembling substrate 10 illustrated in FIG. 6B using the magnet MG and the electric field of the assembling line AL. In this way, a plurality of self-assembled emission structures EST can be transferred onto the display device 700 using a donor DN. Accordingly, the emission structure EST which is applicable to the self-assembling method is formed to easily transfer the first transistor T1 and the light emitting diode 720 onto the display device 700, and can simplify the process, improve reliability, and save space. Specifically, the self-assembling and transferring processes of the first transistor T1 and the light emitting diode 720 are combined together and performed during the same process, which can simplify the process and save costs (e.g., effectively cutting the number of processing steps involved in half).

In the display device 700 according to the example embodiment of the present disclosure, the first transistor T1 and the light emitting diode 720 which are formed by growing the same series of semiconductor materials can be integrally formed together. For example, both the first transistor T1 and the light emitting diode 720 can be formed by growing gallium nitride (GaN) based semiconductor materials, or formed by growing indium gallium arsenide (InGaAs) based semiconductor materials. Accordingly, the first transistor T1 and the light emitting diode 720 formed of the same series of semiconductor materials are grown on one wafer to form together as an integrated emission structure EST.

Figure 9:
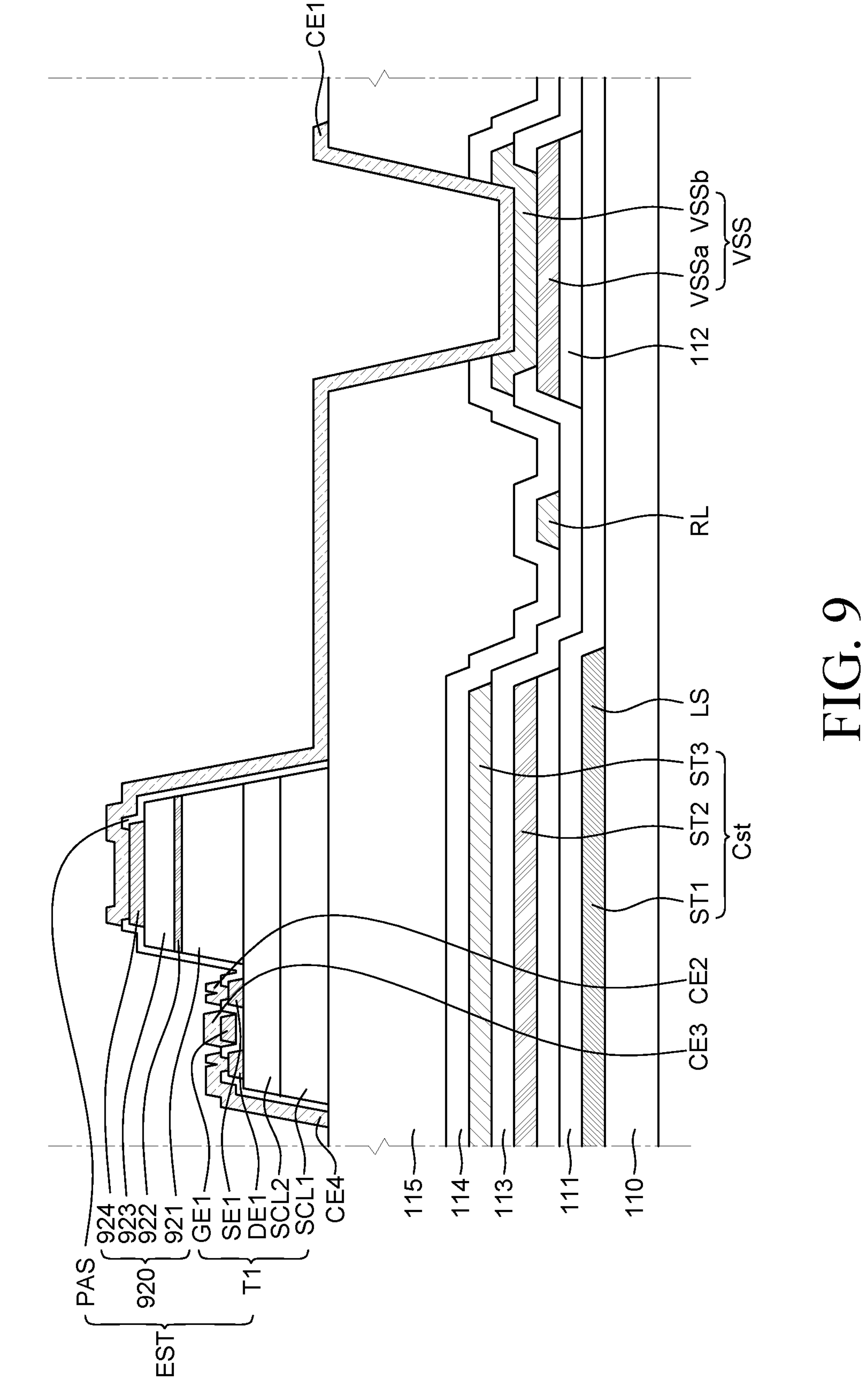
FIG. 9 is a cross-sectional view of a display device according to still another embodiment of the present disclosure.

FIG. 9 is a cross-sectional view of a display device according to still another example embodiment of the present disclosure. The only difference between a display device 900 of FIG. 9 and the display device 700 of FIGS. 7 and 8 is a light emitting diode 920 and a first transistor T1, but the other configuration is substantially the same, so that a redundant description will be omitted.

Referring to FIG. 9, the emission structure EST is disposed on the adhesive layer 115. The emission structure EST includes the light emitting diode 920, the first transistor T1, and the passivation layer PAS. The light emitting diode 920 and the first transistor T1 of the emission structure EST can be integrally formed.

The first transistor T1 includes a first channel formation layer SCL1, a second channel formation layer SCL2, a first gate electrode GE1, a first source electrode SE1, and a first drain electrode DE1.

The second channel formation layer SCL2 is formed on the first channel formation layer SCL1, and the first gate electrode GE1, the first source electrode SE1, and the first drain electrode DE1 are disposed on the second channel formation layer SCL2.

The second channel formation layer SCL2 is doped with an n-type impurity to have a conductivity. For example, the first channel formation layer SCL1 is formed of gallium nitride (GaN), and the second channel formation layer SCL2 can be formed of aluminum gallium nitride (AlGaN) doped with the n-type impurity.

At this time, the first channel formation layer SCL1 and the second channel formation layer SCL2 include a part extending outside of the first gate electrode GE1, the first source electrode SE1, and the first drain electrode DE1. The light emitting diode 920 is disposed on an extending part of the second channel formation layer SCL2. That is, the first channel formation layer SCL1 and the second channel formation layer SCL2 are formed to extend under a lower side of the light emitting diode 920. Accordingly, the light emitting diode 920 can be disposed on the second channel formation layer SCL2 together with the first gate electrode GE1, the first source electrode SE1, and the first drain electrode DE1.

The light emitting diode 920 includes a first semiconductor layer 921, a light emitting layer 922, a second semiconductor layer 923, and a contact electrode 924.

The first semiconductor layer 921 is disposed on or in contact with the second channel formation layer SCL2 of the first transistor T1, and the light emitting layer 922, the second semiconductor layer 923, and the contact electrode 924 are sequentially disposed on the first semiconductor layer 921. The light emitting diode 920 can be a vertical light emitting diode 920 in which the driving current flows in a vertical direction of the light emitting layer 922.

A 2DEG layer which serves as a channel is formed in the vicinity of the bonding interface of the first channel formation layer SCL1 and the second channel formation layer SCL2. The first semiconductor layer 921 of the light emitting diode 920 is disposed on the second channel formation layer SCL2 and spaced apart from the 2DEG layer. However, as described above, the second channel formation layer SCL2 includes the n-type impurity to have a conductivity so that the driving current flowing in the 2DEG layer which is a channel can be applied to the first semiconductor layer 921 of the light emitting diode 920 through the second channel formation layer SCL2.

Accordingly, in the display device 900 according to still another example embodiment of the present disclosure, the first transistor T1 and the light emitting diode 920 are vertically laminated to form the emission structure EST. At this time, the light emitting diode 920 is formed immediately on the second channel formation layer SCL2 so that a process of etching the second channel formation layer SCL2 can be simplified during the process of forming the emission structure EST by growing the semiconductor layer on the wafer. For example, the first channel formation layer SCL1 and the second channel formation layer SCL2 are formed on the entire wafer, and the first semiconductor layer 921, the light emitting layer 922, and the second semiconductor layer 923 of the light emitting diode 920 can be sequentially grown thereon. Finally, the grown layers are patterned into a plurality of parts to form the plurality of emission structures EST. Accordingly, the process of partially etching the second channel formation layer SCL2 to expose the first channel formation layer SCL1 before growing the first semiconductor layer 921 of the light emitting diode 920 can be simplified, which reduces the processing steps.

The example embodiments of the present disclosure can also be described as follows:

According to an aspect of the present disclosure, there is provided a display device. The display device includes a substrate in which a plurality of sub pixels are defined, a light emitting diode disposed in each of the plurality of sub pixels on the substrate, and a first transistor which is disposed in each of the plurality of sub pixels on the substrate to supply a driving current to the light emitting diode. The first transistor is a high electron mobility transistor (HEMT).

The first transistor can include a first channel formation layer formed on the substrate, a second channel formation layer formed on the first channel formation layer, a first source electrode and a first drain electrode which are disposed on the second channel formation layer and are spaced apart from each other, and a first gate electrode disposed on the first source electrode and the first drain electrode. The first channel formation layer and the second channel formation layer can be formed of materials having different energy band gaps.

The light emitting diode can include a first semiconductor layer disposed on the substrate, a light emitting layer disposed on the first semiconductor layer, and a second semiconductor layer disposed on the light emitting layer, and any one of the first semiconductor layer and the second semiconductor layer can be electrically connected to the first transistor.

The display device can further include a second transistor which is disposed between the substrate and the first transistor, and is electrically connected to the first gate electrode. The second transistor can be a thin film transistor.

The display device can further include an adhesive layer disposed between the substrate and the light emitting diode and between the substrate and the first transistor, a low potential power line which is disposed between the substrate and the adhesive layer, and is electrically connected to the light emitting diode, and a high potential power line which is disposed between the substrate and the adhesive layer, and is electrically connected to the first transistor.

The display device can further include a first connection electrode which is disposed on the light emitting diode to electrically connect the first semiconductor layer and the low potential power line, a second connection electrode which is disposed on the first transistor and the light emitting diode to electrically connect the second semiconductor layer and the first source electrode, a third connection electrode which is disposed on the first transistor to electrically connect the first gate electrode and the second transistor, and a fourth connection electrode which is disposed on the first transistor to electrically connect the first drain electrode and the high potential power line.

The light emitting diode can be a lateral light emitting diode.

The first channel formation layer of the first transistor can include a part extending outside of the second channel formation layer and the light emitting diode can be disposed on the extending part of the first channel formation layer.

The first transistor and the light emitting diode can be at least partially in contact with each other to form one emission structure.

A thickness of a part of the first channel formation layer overlapping the second channel formation layer can be larger than a thickness of the remaining part of the first channel formation layer overlapping the light emitting diode, and a side surface corresponding to a bonding interface of the first channel formation layer and the second channel formation layer can be in contact with a side surface of the first semiconductor layer of the light emitting diode.

The first channel formation layer and the first semiconductor layer can be formed of a gallium nitride based material.

The first source electrode can be disposed to closer to the side surface of the first semiconductor layer of the light emitting diode than the first drain electrode.

The first channel formation layer and the second channel formation layer of the first transistor can include a part extending outside of the first gate electrode, the first source electrode, and the first drain electrode, and the light emitting diode can be disposed on the extending part of the second channel formation layer.

Together the first transistor and the light emitting diode can form one emission structure by the second channel formation layer and the first semiconductor layer which are in contact with each other.

The first channel formation layer can be formed of a gallium nitride based material, and the second channel formation layer can be formed of a gallium nitride based material including an n-type impurity.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
- a plurality of sub pixels disposed on a substrate;
- a light emitting diode disposed in a sub pixel among the plurality of sub pixels on the substrate;
- a first transistor disposed in the sub pixel, the first transistor including a first gate electrode and configured to supply a driving current to the light emitting diode; and
- a second transistor disposed between the substrate and the first transistor, the second transistor being electrically connected to the first gate electrode,
- wherein the first transistor is a high electron mobility transistor (HEMT), and
- wherein the second transistor is a thin film transistor.

2. The display device according to claim 1, wherein the first transistor further includes:
- a first channel formation layer disposed on the substrate;
- a second channel formation layer disposed on the first channel formation layer; and
- a first source electrode and a first drain electrode disposed on the second channel formation layer and spaced apart from each other, and
- wherein the first channel formation layer has a different energy band gap than the second channel formation layer.

3. The display device according to claim 2, wherein the light emitting diode includes:
- a first semiconductor layer disposed on the substrate;
- a light emitting layer disposed on the first semiconductor layer; and
- a second semiconductor layer disposed on the light emitting layer, and
- wherein one of the first semiconductor layer and the second semiconductor layer is electrically connected to the first transistor.

4. The display device according to claim 3, wherein the first channel formation layer of the first transistor includes an extending part that extends past the second channel formation layer and under at least a portion of the light emitting diode.

5. The display device according to claim 4, wherein the first transistor and the light emitting diode are at least partially in direct contact with each other to form one emission structure.

6. The display device according to claim 4, wherein a first part of the first channel formation layer overlapping the second channel formation layer is thicker than a second part of the first channel formation layer overlapping the light emitting diode, and
- wherein a side surface of the first transistor corresponding to a bonding interface between the first channel formation layer and the second channel formation layer is in contact with a side surface of the first semiconductor layer of the light emitting diode.

7. The display device according to claim 6, wherein the first channel formation layer and the first semiconductor layer are formed of a gallium nitride based material.

8. The display device according to claim 6, wherein the first source electrode is disposed closer to the side surface of the first semiconductor layer of the light emitting diode than the first drain electrode.

9. The display device according to claim 3, wherein a first portion of the first channel formation layer of the first transistor and a second portion of the second channel formation layer of the first transistor both extend under at least a portion of the light emitting diode.

10. The display device according to claim 9, wherein the first transistor and the light emitting diode form one emission structure and wherein the second channel formation layer and the first semiconductor layer contact each other.

11. The display device according to claim 9, wherein the first channel formation layer is formed of a gallium nitride based material, and the second channel formation layer is formed of a gallium nitride based material including an n-type impurity.

12. The display device according to claim 3, wherein an upper surface of the first semiconductor layer includes a first part overlapping with a lower surface of the second semiconductor layer, and a second part that extends past an edge of the second semiconductor layer and does not overlap with the lower surface of the second semiconductor layer.

13. The display device according to claim 12, wherein the first semiconductor layer outwardly protrudes away from the second semiconductor layer in all directions in a plan view.

14. The display device according to claim 3, wherein the light emitting diode further includes a first electrode disposed on the first semiconductor layer, and wherein the first electrode is spaced apart from a part of from the light emitting layer and the second semiconductor layer.

15. The display device according to claim 3, wherein the first channel formation layer and the second channel formation layer are bonded to each other to form a hetero junction structure and a two-dimensional electron gas layer.

16. The display device according to claim 15, wherein the first semiconductor layer is disposed on the second channel formation layer and spaced apart from the two-dimensional electron gas layer.

17. The display device according to claim 2, wherein the first channel formation layer and the second channel formation layer both extend under at least a portion of the light emitting diode.

18. The display device according to claim 1, further comprising:

an adhesive layer disposed between the substrate and the light emitting diode, and between the substrate and the first transistor;

a low potential power line disposed between the substrate and the adhesive layer, the low potential power line being electrically connected to the light emitting diode; and a high potential power line disposed between the substrate and the adhesive layer, the high potential power line being electrically connected to the first transistor.

19. The display device according to claim 18, further comprising:

a first connection electrode disposed on the light emitting diode, the first connection electrode electrically connecting a first semiconductor layer with the low potential power line;

a second connection electrode disposed on both of the first transistor and the light emitting diode, the second connection electrode electrically connecting a second semiconductor layer with a first source electrode of the first transistor;

a third connection electrode disposed on the first transistor, the third connection electrode electrically connecting the first gate electrode of the first transistor with the second transistor; and a fourth connection electrode disposed on the first transistor, the fourth connection electrode electrically connecting a first drain electrode of the first transistor with the high potential power line.

20. The display device according to claim 19, wherein the light emitting diode is a lateral light emitting diode.

21. The display device according to claim 18, wherein the light emitting diode further includes a contact electrode disposed on a second semiconductor layer, and wherein a first connection electrode electrically connects the contact electrode with the low potential power line.

22. A display device, comprising:

a light emitting diode disposed in a sub pixel on a substrate;

a first transistor disposed in the sub pixel and configured to supply a driving current to the light emitting diode; and a second transistor disposed between the substrate and the first transistor, wherein the first transistor includes:

a first gate electrode;

a first channel formation layer; and a second channel formation layer disposed on the first channel formation layer, wherein the driving current is configured to flow along a boundary interface between the first channel formation layer and the second channel formation layer, the second transistor being electrically connected to the first gate electrode, and wherein the second transistor is a thin film transistor.

23. The display device according to claim 22, wherein at least a portion of the first channel formation layer overlaps with the light emitting diode or at least a portion of the second channel formation layer overlaps with the light emitting diode.

* * * * *